United States Patent
Kim et al.

(10) Patent No.: US 11,769,946 B2
(45) Date of Patent: Sep. 26, 2023

(54) ELECTRONIC DEVICE COMPRISING ANTENNA

(71) Applicant: Samsung Electronics Co., Ltd., Suwon-si (KR)

(72) Inventors: Jae Hyung Kim, Yongin-si (KR); Kyung Bae Ko, Hwaseong-si (KR); Tae Gyu Kim, Hwaseong-si (KR); Je Sun Moon, Suwon-si (KR); Jin Kyu Bang, Suwon-si (KR); Sang Hoon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1191 days.

(21) Appl. No.: 16/344,172

(22) PCT Filed: Nov. 2, 2017

(86) PCT No.: PCT/KR2017/012363
§ 371 (c)(1),
(2) Date: Apr. 23, 2019

(87) PCT Pub. No.: WO2018/084615
PCT Pub. Date: May 11, 2018

(65) Prior Publication Data
US 2019/0288392 A1    Sep. 19, 2019

(30) Foreign Application Priority Data
Nov. 7, 2016   (KR) .................. 10-2016-0147315

(51) Int. Cl.
*H01Q 5/30*   (2015.01)
*H05K 7/14*   (2006.01)
(Continued)

(52) U.S. Cl.
CPC .............. *H01Q 5/30* (2015.01); *H01Q 1/24* (2013.01); *H01Q 1/38* (2013.01); *H01Q 5/364* (2015.01);
(Continued)

(58) Field of Classification Search
CPC .......... H01Q 5/30; H01Q 1/38; H05K 5/0086; H05K 5/0226; H05K 7/1427; H05K 7/14; H05K 5/00; H05K 5/02; H04B 1/3827
(Continued)

(56) References Cited

U.S. PATENT DOCUMENTS 6,034,644 A * 3/2000 Okabe ................. H01Q 13/106
343/750
9,590,291 B2   3/2017 Lee et al.
(Continued)

FOREIGN PATENT DOCUMENTS

CN    103531911 A   1/2014
FR    2 771 552 A1  5/1999
(Continued)

OTHER PUBLICATIONS

European Office Action dated May 12, 2020, issued in European Application No. 17867193.9.
(Continued)

*Primary Examiner* — Hai V Tran
(74) *Attorney, Agent, or Firm* — Jefferson IP Law, LLP

(57) ABSTRACT

An electronic device according to an embodiment may comprise: a housing including a first slit having a length corresponding to a first frequency and a second slit extending from one point of the first slit in a different direction from the first slit and having a length corresponding to a second frequency, and configured to resonate at the first frequency and the second frequency by the first slit and the second slit; a printed circuit board disposed in the housing
(Continued)

and at least partially made of a non-conductive material in regions corresponding to the first slit and the second slit; and a power supply unit for supplying power through one point of the housing, adjacent to the first slit or the second slit. Various other embodiments recognized from the specification are also possible.

16 Claims, 17 Drawing Sheets

(51) Int. Cl.
 *H05K 5/00* (2006.01)
 *H05K 5/02* (2006.01)
 *H04B 1/3827* (2015.01)
 *H01Q 5/364* (2015.01)
 *H01Q 1/24* (2006.01)
 *H01Q 13/10* (2006.01)
 *H01Q 1/38* (2006.01)

(52) U.S. Cl.
 CPC ........... *H01Q 13/10* (2013.01); *H04B 1/3827* (2013.01); *H05K 5/0086* (2013.01); *H05K 5/0226* (2013.01); *H05K 7/1427* (2013.01)

(58) Field of Classification Search
 USPC ........................................................ 343/767
 See application file for complete search history.

(56) References Cited

U.S. PATENT DOCUMENTS

| | | |
|---|---|---|
| 2004/0239575 A1 | 12/2004 | Shoji et al. |
| 2006/0164314 A1* | 7/2006 | Yuanzhu ................ H01Q 13/18 |
| | | 343/770 |
| 2008/0143613 A1 | 6/2008 | Iwai et al. |
| 2014/0218250 A1 | 8/2014 | Kim et al. |
| 2014/0361932 A1* | 12/2014 | Irci ...................... H01Q 1/2266 |
| | | 343/702 |
| 2015/0070219 A1 | 3/2015 | Dinh et al. |
| 2015/0380827 A1 | 12/2015 | Tahtinen |
| 2016/0056531 A1 | 2/2016 | Lee et al. |
| 2016/0079655 A1 | 3/2016 | Gu et al. |
| 2017/0048363 A1* | 2/2017 | Lee ........................ H01Q 5/314 |
| 2017/0077603 A1* | 3/2017 | Krogerus ................. H01Q 1/38 |

FOREIGN PATENT DOCUMENTS

| | | |
|---|---|---|
| JP | 2009105993 A | 5/2009 |
| JP | 2014-103589 A | 6/2014 |
| KR | 10-2014-0020670 A | 2/2014 |
| KR | 10-2014-0100384 A | 8/2014 |
| KR | 10-2016-0023178 A | 3/2016 |
| KR | 10-2016-0061770 A | 6/2016 |

OTHER PUBLICATIONS

Extended European Search Report dated Sep. 5, 2019, issued in European Application No. 17867193.9.

* cited by examiner

ELECTRONIC DEVICE COMPRISING ANTENNA

TECHNICAL FIELD

Embodiments disclosed in the disclosure relates to a structure of an antenna of an electronic device.

BACKGROUND ART

A wireless communication technology makes it possible to transmit and receive various forms of information such as a text, an image, a video, voice, and the like. The wireless communication technology is being developed to transmit and receive more information faster. As the wireless communication technology develops, an electronic device such as a wireless communication-possible smartphone or tablet may provide a service using a communication function such as digital multimedia broadcasting (DMB), global positioning system (GPS), wireless-fidelity (Wi-Fi), long-term evolution (LTE), near field communication (NFC), magnetic stripe transmission (MST), or the like. To provide such a service, the electronic device may include one or more antennas.

Technical Problem

An electronic device may include a housing made of metal. The housing may cover most of the rear surface of the electronic device or most of the front surface of the electronic device. The performance of an antenna included in the electronic device may be degraded due to the above-described housing. For the purpose of overcoming the performance degradation of the antenna, the manufacturer may utilize the housing as a radiator by forming a slit in the housing. The resonant frequency of the housing may be adjusted by adjusting the length of the slit. However, when the slit is formed in the housing, it is difficult to implement a multiband antenna using the housing. When feeding two or more points to implement a multiband antenna, the radiation performance of the antenna may be degraded.

To solve the above-mentioned problems and tasks issued in the disclosure, embodiments disclosed in the disclosure may implement a multiband antenna that resonates at two or more frequencies by forming a slit in the housing of an electronic device.

Technical Solution

According to an embodiment disclosed in the disclosure, an electronic device may include a housing, in which a first slit having a length corresponding to a first frequency and a second slit extending from one point of the first slit in a direction different from the first slit and having a length corresponding to a second frequency, and resonating at the first frequency and the second frequency by the first slit and the second slit, a printed circuit board, which is disposed inside the housing and in which at least part of a region corresponding to the first slit and the second slit is made of a non-conductive material, and a feeding part feeding through one point of the housing adjacent to the first slit or the second slit.

Furthermore, according to an embodiment disclosed in the disclosure, an electronic device may include a housing in which a first slit configured to resonate at a first frequency and a second frequency and having a length corresponding to the first frequency and a second slit extending from one point of the first slit in a direction different from the first slit and having a length corresponding to the second frequency are formed, a printed circuit board, which is disposed inside the housing and in which a slit is formed in at least part of a region corresponding to the first slit and the second slit, and a feeding part feeding through one point of the housing adjacent to the first slit or the second slit.

Moreover, according to an embodiment disclosed in the disclosure, a portable electronic device may include a housing including a first plate, a second plate facing in a direction opposite to the first plate, and a side member surrounding a space between the first plate and the second plate, a printed circuit board (PCB) positioned inside the space between the first plate and the second plate, a processor positioned on the PCB, and a wireless communication circuit positioned in the space and electrically connected to the processor. A substantial portion of the second plate may be made of an electrical conductive material. The second plate may have a rectangular shape, the rectangular shape including a first side extending in a first direction and having a first length, a second side extending in a second direction perpendicular to the first direction and having a second length longer than the first length, a third side extending in the first direction to be parallel to the first side and having the first length, and a fourth side extending in the second direction to be parallel to the second side and having the second length. The second plate may include a first slit extending from a first location of the second side or from a periphery of the first location in the first direction between the first side and the third side when viewed from above the second plate, a second slit extending from the first location of the second side or from the periphery of the first location in the second direction when viewed from above the second plate and connected to the first slit, and an electrical non-conductive material configured to fill at least part of the first slit or the second slit. The PCB may include a slit facing the first slit of the second plate. The wireless communication circuit may be electrically connected to a first conductive portion on the PCB. The first conductive portion may be disposed, at a periphery of the second side of the second plate and between the first side of the second plate and the first slit, when viewed from above the second plate, and the first conductive portion may be electrically connected to one point of the second plate facing the first conductive portion of the PCB.

Advantageous Effects

According to various embodiments of the disclosure, an antenna that resonates at two or more bands may be implemented by forming two or more slits in the housing of an electronic device.

The performance of the slit antenna formed in the housing may be improved by adapting the printed circuit board in which the conductive material is removed in the region corresponding to the slit formed in the housing.

The isolation of the multiband antenna may be ensured by feeding only one point of the housing.

Besides, a variety of effects directly or indirectly understood through this disclosure may be provided.

MODE FOR INVENTION

Figure 1:
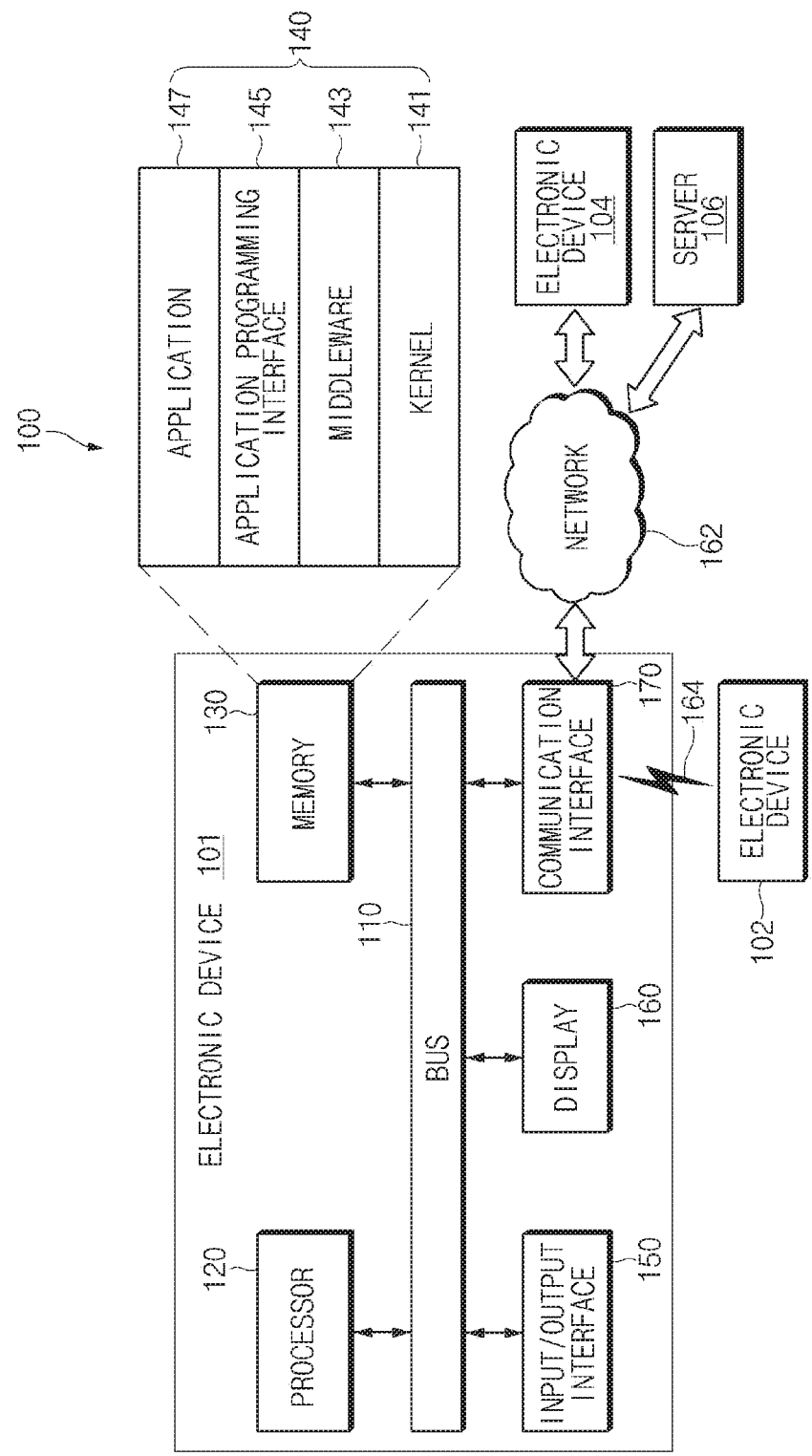
FIG. 1 illustrates an electronic device in a network environment, according to various embodiments.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure. With regard to description of drawings, similar components may be marked by similar reference numerals. The terms of a singular form may include plural forms unless otherwise specified. In this disclosure, the expressions "A or B", "at least one of A or/and B", or "one or more of A or/and B", and the like may include any and all combinations of one or more of the associated listed items. The terms, such as "first", "second", and the like may be used to refer to various components regardless of the order and/or the priority and to distinguish the relevant components from other components, but do not limit the components. When an component (e.g., a first component) is referred to as being "(operatively or communicatively) coupled with/to" or "connected to" another component (e.g., a second component), the component may be directly coupled with/to or connected to the other component or an intervening component (e.g., a third component) may be present.

According to the situation, the expression "configured to" used in this disclosure may be used as, for example, the expression "suitable for", "having the capacity to", "adapted to", "made to", "capable of", or "designed to" in hardware or software. The expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

An electronic device according to various embodiments of this disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit). According to various embodiments, the electronic device may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, media boxes (e.g., Samsung HomeSync™, Apple TV™, or Google TV™), game consoles (e.g., Xbox™ or PlayStation™) electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, drones, automatic teller's machines (ATMs), points of sales (POSs) of stores, or internet of things (e.g., light bulbs, various sensors, sprinkler devices, fire alarms, thermostats, street lamps, toasters, exercise equipment, hot water tanks, heaters, boilers, and the like). According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be a flexible electronic device or a combination of two or more above-described devices. Furthermore, an electronic device according to an embodiment of this disclosure may not be limited to the above-described electronic devices. In this disclosure, the term "user" may refer to a person who uses an electronic device or may refer to a device (e.g., an artificial intelligence electronic device) that uses the electronic device.

FIG. 1 illustrates an electronic device 101 in a network environment 100 according to various embodiments. Referring to FIG. 1, the electronic device 101 may include a bus 110, a processor 120, a memory 130, an input/output interface 150, a display 160, and a communication interface 170. According to an embodiment, the electronic device 101 may not include at least one of the above-described components or may further include other component(s). The bus 110 may interconnect the above-described components 110 to 170 and may include a circuit for conveying communications (e.g., a control message and/or data) among the above-described components. The processor 120 may include one or more of a central processing unit (CPU), an application processor (AP), or a communication processor (CP). For example, the processor 120 may perform an arithmetic operation or data processing associated with control and/or communication of at least other components of the electronic device 101.

The memory 130 may include a volatile and/or nonvolatile memory. For example, the memory 130 may store instructions or data associated with at least one other component(s) of the electronic device 101. According to an embodiment, the memory 130 may store software and/or a program 140. The program 140 may include, for example, a kernel 141, a middleware 143, an application programming interface (API) 145, and/or an application program (or "an application") 147. At least a part of the kernel 141, the middleware 143, or the API 145 may be referred to as an "operating system (OS)". For example, the kernel 141 may control or manage system resources (e.g., the bus 110, the processor 120, the memory 130, and the like) that are used to execute operations or functions of other programs (e.g., the middleware 143, the API 145, and the application program 147). Furthermore, the kernel 141 may provide an interface that allows the middleware 143, the API 145, or the application program 147 to access discrete components of the electronic device 101 so as to control or manage system resources.

The middleware 143 may perform, for example, a mediation role such that the API 145 or the application program 147 communicates with the kernel 141 to exchange data. Furthermore, the middleware 143 may process one or more task requests received from the application program 147 according to a priority. For example, the middleware 143 may assign the priority, which makes it possible to use a system resource (e.g., the bus 110, the processor 120, the memory 130, or the like) of the electronic device 101, to at least one of the application program 147 and may process the one or more task requests. The API 145 may be an interface through which the application program 147 controls a function provided by the kernel 141 or the middleware 143, and may include, for example, at least one interface or function (e.g., an instruction) for a file control, a window control, image processing, a character control, or the like. The input/output interface 150 may transmit an instruction or data input from a user or another external device, to other component(s) of the electronic device 101 or may output an instruction or data, received from other component(s) of the electronic device 101, to a user or another external device.

The display 160 may include, for example, a liquid crystal display (LCD), a light-emitting diode (LED) display, an organic LED (OLED) display, a microelectromechanical systems (MEMS) display, or an electronic paper display. The display 160 may display, for example, various contents (e.g., a text, an image, a video, an icon, a symbol, and the like) to a user. The display 160 may include a touch screen and may receive, for example, a touch, gesture, proximity, or hovering input using an electronic pen or a part of a user's body. For example, the communication interface 170 may establish communication between the electronic device 101 and an external device (e.g., the first electronic device 102, the second electronic device 104, or the server 106). For example, the communication interface 170 may be connected to the network 162 over wireless communication or wired communication to communicate with the external device (e.g., the second electronic device 104 or the server 106).

For example, the wireless communication may include cellular communication using at least one of long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like. The wireless communication may include at least one of wireless fidelity (Wi-Fi), Bluetooth, Bluetooth low energy (BLE), Zigbee, near field communication (NFC), magnetic stripe transmission (MST), radio frequency (RF), a body area network, or the like. According to an embodiment, the wireless communication may include GNSS. The GNSS may be one of, for example, a global positioning system (GPS), a global navigation satellite system (Glonass), a Beidou navigation satellite system (hereinafter referred to as "Beidou"), or an European global satellite-based navigation system (hereinafter referred to as "Galileo"). Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), power line communication, a plain old telephone service (POTS), or the like. The network 162 may include at least one of telecommunications networks, for example, a computer network (e.g., LAN or WAN), an Internet, or a telephone network.

Each of the first and second external electronic devices 102 and 104 may be a device of which the type is different from or the same as that of the electronic device 101. According to various embodiments, all or a portion of operations that the electronic device 101 will perform may be executed by another or plural electronic devices (e.g., the first electronic device 102, the second electronic device 104 or the server 106). According to an embodiment, in the case where the electronic device 101 executes any function or service automatically or in response to a request, the electronic device 101 may not perform the function or the service internally, but, alternatively additionally, it may request at least a portion of a function associated with the electronic device 101 at other electronic device (e.g., the electronic device 102 or 104 or the server 106). The other electronic device (e.g., the electronic device 102 or 104 or the server 106) may execute the requested function or additional function and may transmit the execution result to the electronic device 101. The electronic device 101 may provide the requested function or service using the received result or may additionally process the received result to provide the requested function or service. To this end, for example, cloud computing, distributed computing, or client-server computing may be used.

Figure 2:
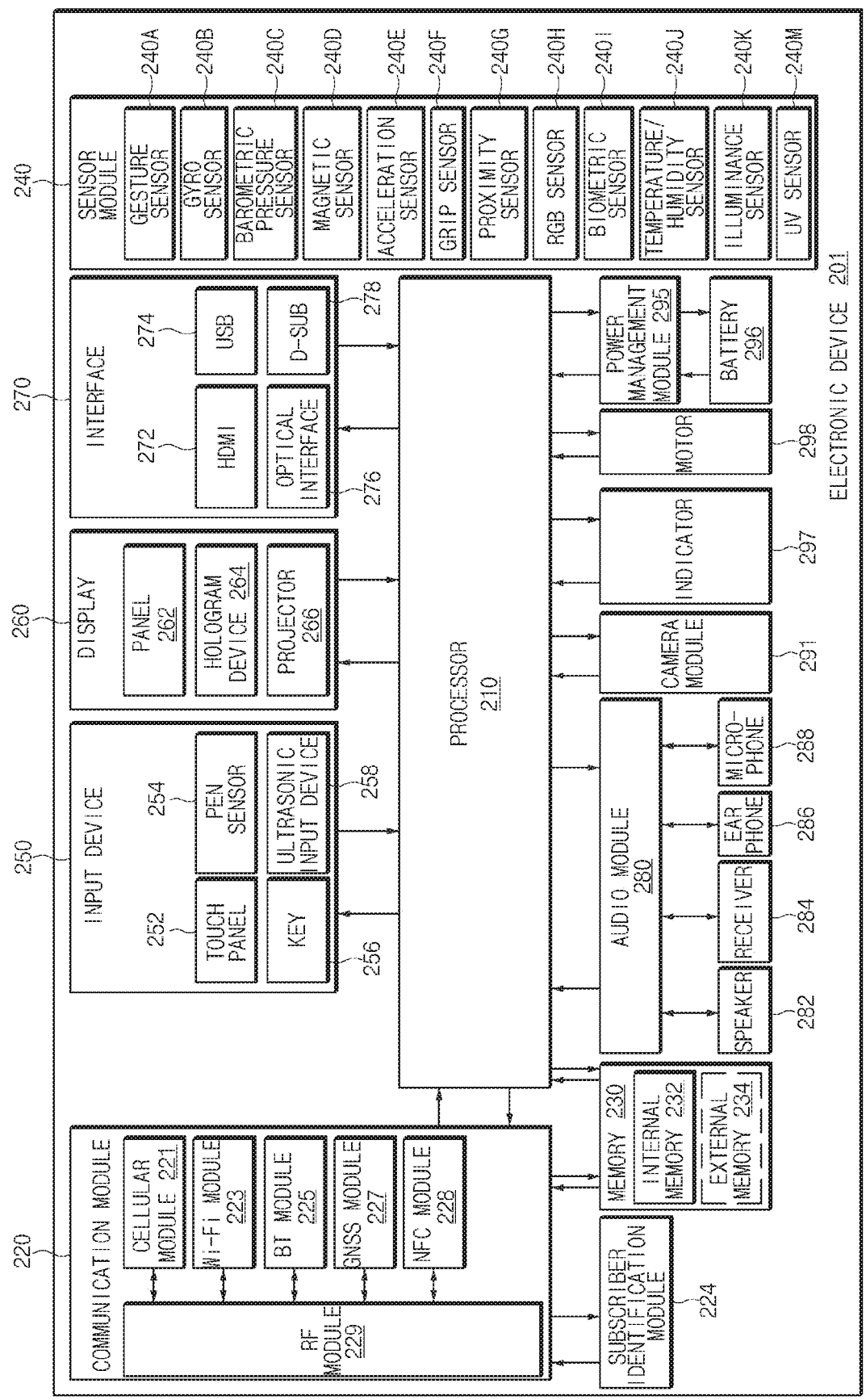
FIG. 2 illustrates a block diagram of the electronic device, according to various embodiments.

FIG. 2 illustrates a block diagram of an electronic device 201, according to various embodiments. An electronic device 201 may include, for example, all or a part of the electronic device 101 illustrated in FIG. 1. The electronic device 201 may include one or more processors (e.g., an application processor (AP)) 210, a communication module 220, a subscriber identification module 224, a memory 230, a sensor module 240, an input device 250, a display 260, an interface 270, an audio module 280, a camera module 291, a power management module 295, a battery 296, an indicator 297, and a motor 298. The processor 210 may drive, for example, an operating system (OS) or an application to control a plurality of hardware or software components connected to the processor 210 and may process and compute a variety of data. For example, the processor 210 may be implemented with a System on Chip (SoC). According to an embodiment, the processor 210 may further include a graphic processing unit (GPU) and/or an image signal processor. The processor 210 may include at least a part (e.g., a cellular module 221) of components illustrated in FIG. 2. The processor 210 may load a command or data, which is received from at least one of other components (e.g., a nonvolatile memory), into a volatile memory and process the loaded instruction or data. The processor 210 may store result data in the nonvolatile memory.

The communication module 220 may be configured the same as or similar to the communication interface 170 of FIG. 1. The communication module 220 may include the cellular module 221, a Wi-Fi module 223, a Bluetooth (BT) module 225, a GNSS module 227, a near field communication (NFC) module 228, and a radio frequency (RF) module 229. The cellular module 221 may provide, for example, voice communication, video communication, a character service, an Internet service, or the like over a communication network. According to an embodiment, the cellular module 221 may perform discrimination and authentication of the electronic device 201 within a communication network by using the subscriber identification module (e.g., a SIM card) 224. According to an embodiment, the cellular module 221 may perform at least a portion of functions that the processor 210 provides. According to an embodiment, the cellular module 221 may include a communication processor (CP). According to an embodiment, at least a part (e.g., two or more) of the cellular module 221, the Wi-Fi module 223, the BT module 225, the GNSS module 227, or the NFC module 228 may be included within one Integrated Circuit (IC) or an IC package. For example, the RF module 229 may transmit and receive a communication signal (e.g., an RF signal). For example, the RF module 229 may include a transceiver, a power amplifier module (PAM), a frequency filter, a low noise amplifier (LNA), an antenna, or the like. According to another embodiment, at least one of the cellular module 221, the Wi-Fi module 223, the BT module 225, the GNSS module 227, or the NFC module 228 may transmit and receive an RF signal through a separate RF module. The subscriber identification module 224 may include, for example, a card and/or embedded SIM that includes a subscriber identification module and may include unique identify information (e.g., integrated circuit card identifier (ICCID)) or subscriber information (e.g., international mobile subscriber identity (IMSI)).

The memory 230 (e.g., the memory 130) may include an internal memory 232 or an external memory 234. For example, the internal memory 232 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory, a hard drive, or a solid state drive (SSD). The external memory 234 may include a flash drive such as compact flash (CF), secure digital (SD), micro secure digital (Micro-SD), mini secure digital (Mini-SD), extreme digital (xD), a multimedia card (MMC), a memory stick, or the like. The external memory 234 may be operatively and/or physically connected to the electronic device 201 through various interfaces.

The sensor module 240 may measure, for example, a physical quantity or may detect an operation state of the electronic device 201. The sensor module 240 may convert the measured or detected information to an electric signal. For example, the sensor module 240 may include at least one of a gesture sensor 240A, a gyro sensor 240B, a barometric pressure sensor 240C, a magnetic sensor 240D, an acceleration sensor 240E, a grip sensor 240F, the proximity sensor 240G, a color sensor 240H (e.g., red, green, blue (RGB) sensor), a biometric sensor 240I, a temperature/humidity sensor 240J, an illuminance sensor 240K, or an UV sensor 240M. Although not illustrated, additionally or alternatively, the sensor module 240 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling at least one or more sensors included therein. According to an embodiment, the electronic device 201 may further include a processor that is a part of the processor 210 or independent of the processor 210 and is configured to control the sensor module 240. The processor may control the sensor module 240 while the processor 210 remains at a sleep state.

The input device 250 may include, for example, a touch panel 252, a (digital) pen sensor 254, a key 256, or an ultrasonic input unit 258. For example, the touch panel 252 may use at least one of capacitive, resistive, infrared and ultrasonic detecting methods. Also, the touch panel 252 may further include a control circuit. The touch panel 252 may further include a tactile layer to provide a tactile reaction to a user. The (digital) pen sensor 254 may be, for example, a part of a touch panel or may include an additional sheet for recognition. The key 256 may include, for example, a physical button, an optical key, or a keypad. The ultrasonic input device 258 may detect (or sense) an ultrasonic signal, which is generated from an input device, through a microphone (e.g., a microphone 288) and may check data corresponding to the detected ultrasonic signal.

The display 260 (e.g., the display 160) may include a panel 262, a hologram device 264, a projector 266, and/or a control circuit for controlling the panel 262, the hologram device 264, or the projector 266. The panel 262 may be implemented, for example, to be flexible, transparent or wearable. The panel 262 and the touch panel 252 may be integrated into a single module. According to an embodiment, the panel 262 may include a pressure sensor (or force sensor) that measures the intensity of touch pressure by a user. The pressure sensor may be implemented integrally with the touch panel 252, or may be implemented as at least one sensor separately from the touch panel 252. The hologram device 264 may display a stereoscopic image in a space using a light interference phenomenon. The projector 266 may project light onto a screen so as to display an image. For example, the screen may be arranged in the inside or the outside of the electronic device 201. The interface 270 may include, for example, a high-definition multimedia interface (HDMI) 272, a universal serial bus (USB) 274, an optical interface 276, or a D-subminiature (D-sub) 278. The interface 270 may be included, for example, in the communication interface 170 illustrated in FIG. 1. Additionally or alternatively, the interface 270 may include, for example, a mobile high definition link (MHL) interface, a SD card/multi-media card (MMC) interface, or an infrared data association (IrDA) standard interface.

The audio module 280 may convert a sound and an electric signal in dual directions. At least a component of the audio module 280 may be included, for example, in the input/output interface 150 illustrated in FIG. 1. The audio module 280 may process, for example, sound information that is input or output through a speaker 282, a receiver 284, an earphone 286, or the microphone 288. For example, the camera module 291 may shoot a still image or a video. According to an embodiment, the camera module 291 may include at least one or more image sensors (e.g., a front sensor or a rear sensor), a lens, an image signal processor (ISP), or a flash (e.g., an LED or a xenon lamp). The power management module 295 may manage, for example, power of the electronic device 201. According to an embodiment, a power management integrated circuit (PMIC), a charger IC, or a battery or fuel gauge may be included in the power management module 295. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, a rectifier, or the like. The battery gauge may measure, for example, a remaining capacity of the battery 296 and a voltage, current or temperature thereof while the battery is charged. The battery 296 may include, for example, a rechargeable battery and/or a solar battery.

The indicator 297 may display a specific state of the electronic device 201 or a part thereof (e.g., the processor 210), such as a booting state, a message state, a charging state, and the like. The motor 298 may convert an electrical signal into a mechanical vibration and may generate the following effects: vibration, haptic, and the like. The electronic device 201 may include a processing device (e.g., a GPU) for supporting a mobile TV. The processing device for supporting the mobile TV may process media data according to the standards of digital multimedia broadcasting (DMB), digital video broadcasting (DVB), MediaFLO™, or the like. Each of the above-mentioned components of the electronic device according to various embodiments of the disclosure may be configured with one or more components, and the names of the components may be changed according to the type of the electronic device. In various embodiments, some components of the electronic device (e.g., the electronic device 201) may be omitted or other additional components may be added. Furthermore, some of the components of the electronic device may be combined with each other so as to form one entity, so that the functions of the components may be performed in the same manner as before the combination.

Figure 3:
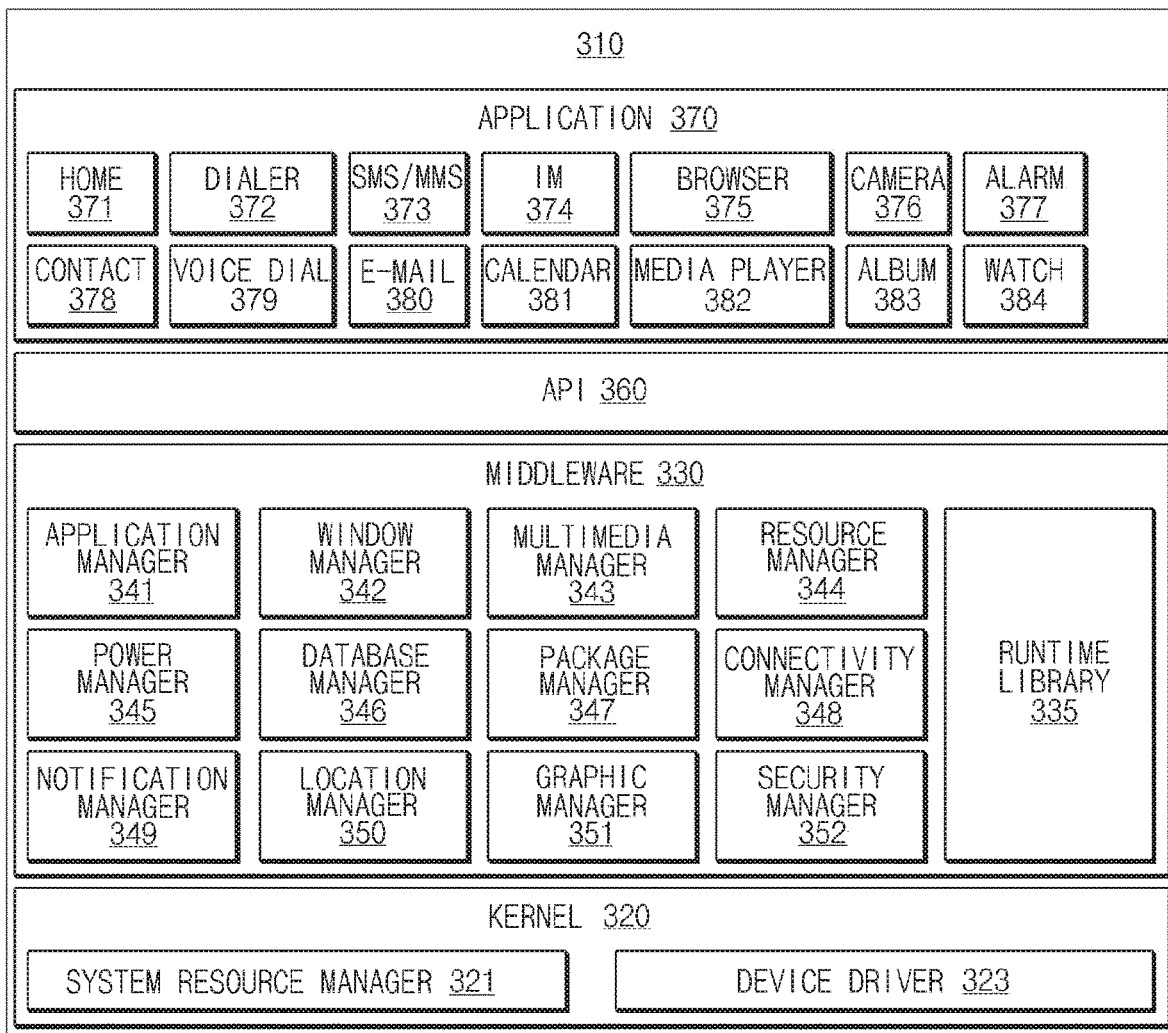
FIG. 3 illustrates a block diagram of a program module according to various embodiments.

FIG. 3 illustrates a block diagram of a program module, according to various embodiments. According to an embodiment, a program module 310 (e.g., the program 140) may include an operating system (OS) to control resources associated with an electronic device (e.g., the electronic device 101), and/or diverse applications (e.g., the application program 147) driven on the OS. The OS may be, for example, Android™, iOS™, Windows™, Symbian™, Tizen™, or Bada™. Referring to FIG. 3, the program module 310 may include a kernel 320 (e.g., the kernel 141), a middleware 330 (e.g., the middleware 143), an application programming interface (API) 360 (e.g., the API 145), and/or an application 370 (e.g., the application program 147). At least a portion of the program module 310 may be preloaded on an electronic device or may be downloadable from an external electronic device (e.g., the first electronic device 102, the second electronic device 104, the server 106, or the like).

The kernel 320 (e.g., the kernel 141) may include, for example, a system resource manager 321 or a device driver 323. The system resource manager 321 may control, allocate, or retrieve system resources. According to an embodiment, the system resource manager 321 may include a process managing unit, a memory managing unit, a file system managing unit, or the like. The device driver 323 may include, for example, a display driver, a camera driver, a Bluetooth driver, a shared memory driver, a USB driver, a keypad driver, a Wi-Fi driver, an audio driver, or an inter-process communication (IPC) driver. The middleware 330 may provide, for example, a function that the application 370 needs in common, or may provide diverse functions to the application 370 through the API 360 to allow the application 370 to efficiently use limited system resources of the electronic device. According to an embodiment, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The runtime library 335 may include, for example, a library module that is used by a compiler to add a new function through a programming language while the application 370 is being executed. The runtime library 335 may perform input/output management, memory management, or capacities about arithmetic functions. The application manager 341 may manage, for example, a life cycle of at least one application of the application 370. The window manager 342 may manage a graphic user interface (GUI) resource that is used in a screen. The multimedia manager 343 may identify a format necessary for playing diverse media files, and may perform encoding or decoding of media files by using a codec suitable for the format. The resource manager 344 may manage resources such as a memory space or source code of the application 370. The power manager 345 may manage a battery or power, and may provide power information for an operation of an electronic device. According to an embodiment, the power manager 345 may operate with a basic input/output system (BIOS). The database manager 346 may generate, search for, or modify database that is to be used in the application 370. The package manager 347 may install or update an application that is distributed in the form of package file.

The connectivity manager 348 may manage, for example, wireless connection. The notification manager 349 may provide an event, for example, arrival message, appointment, or proximity notification to a user. For example, the location manager 350 may manage location information about an electronic device. The graphic manager 351 may manage a graphic effect that is provided to a user, or manage a user interface relevant thereto. The security manager 352 may provide, for example, system security or user authentication. According to an embodiment, the middleware 330 may include a telephony manager for managing a voice or video call function of the electronic device or a middleware module that combines diverse functions of the above-described components. According to an embodiment, the middleware 330 may provide a module specialized to each OS kind to provide differentiated functions. Additionally, the middleware 330 may dynamically remove a part of the preexisting components or may add new components thereto. The API 360 may be, for example, a set of programming functions and may be provided with a configuration that is variable depending on an OS. For example, in the case where an OS is the android or the iOS, it may provide one API set per platform. In the case where an OS is the tizen, it may provide two or more API sets per platform.

The application 370 may include, for example, applications such as a home 371, a dialer 372, an SMS/MMS 373, an instant message (IM) 374, a browser 375, a camera 376, an alarm 377, a contact 378, a voice dial 379, an e-mail 380, a calendar 381, a media player 382, an album 383, a watch 384, health care (e.g., measuring an exercise quantity, blood sugar, or the like) or offering of environment information (e.g., information of barometric pressure, humidity, temperature, or the like). According to an embodiment, the application 370 may include an information exchanging application to support information exchange between an electronic device and an external electronic device. The information exchanging application may include, for example, a notification relay application for transmitting specific information to an external electronic device, or a device management application for managing the external electronic device. For example, the notification relay application may include a function of transmitting notification information, which arise from other applications, to an external electronic device or may receive, for example, notification information from an external electronic device and provide the notification information to a user. The device management application may install, delete, or update for example, a function (e.g., turn-on/turn-off of an external electronic device itself (or a part of components) or adjustment of brightness (or resolution) of a display) of the external electronic device which communicates with the electronic device, and an application running in the external electronic device. According to an embodiment, the application 370 may include an application (e.g., a health care application of a mobile medical device) that is assigned in accordance with an attribute of an external electronic device. According to an embodiment, the application 370 may include an application that is received from an external electronic device. At least a portion of the program module 310 may be implemented by software, firmware, hardware (e.g., the processor 210), or a combination (e.g., execution) of two or more thereof, and may include modules, programs, routines, sets of instructions, processes, or the like for performing one or more functions.

Figure 4:
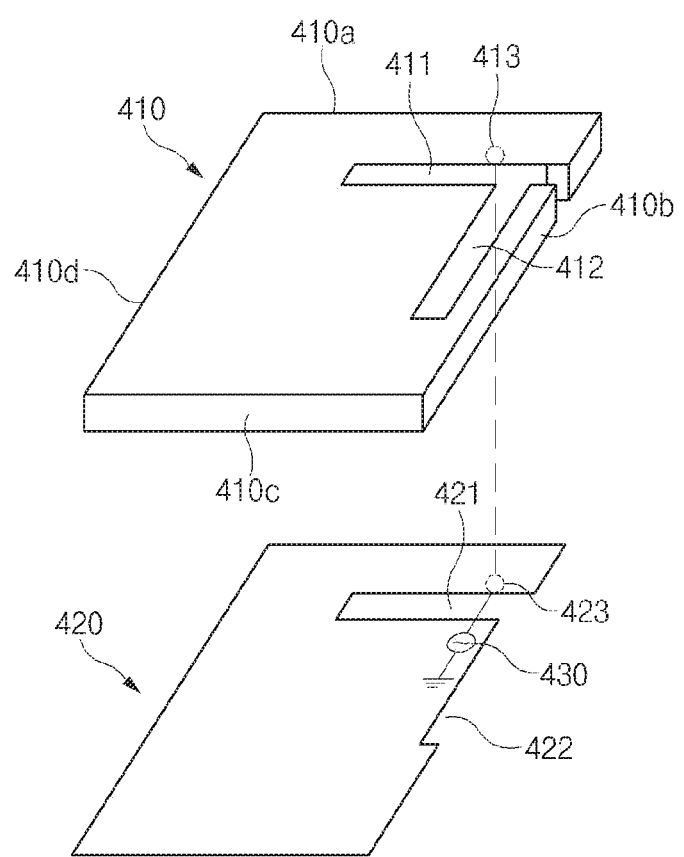
FIG. 4 illustrates housing and a printed circuit board included in an electronic device, according to an embodiment.

FIG. 4 illustrates housing and a printed circuit board included in an electronic device, according to an embodiment.

Referring to FIG. 4, an electronic device according to an embodiment may include housing 410, a printed circuit board 420, and a feeding part 430.

According to an embodiment, the housing 410 may include a conductive member. For example, the housing 410 may be formed of a metal. The housing 410 may be implemented in the form that covers at least part of one surface of the electronic device. For example, the housing 410 may cover at least part of the rear (or front) surface and side surface of the electronic device. For example, the housing 410 may have a rectangular shape; the rectangular shape may include a first side 410*a* that extends in a first direction and has a first length, a second side 410*b* that extends in a second direction perpendicular to the first direction and has a second length longer than the first length, a third side 410*c* that extends parallel to the first side 410*a* in the first direction and has the first length, and a fourth side 410*d* that extends parallel to the second side 410*b* in the second direction and has the second length. The housing 410 may be configured to resonate at a first frequency and a second frequency. For example, the housing 410 may resonate at a first frequency and a second frequency by a first slit 411 and a second slit 412 that are described below.

According to an embodiment, the first slit 411 and the second slit 412 may be formed in the housing 410. For example, the first slit 411 may extend in a direction perpendicular to the edge from the edge (e.g., the right edge) of the housing 410. When viewed from above the housing 410, the first slit 411 may extend in a first direction between the first side 410*a* and the third side 410*c* from the first location of the second side 410*b* or from the periphery of the first location. The first slit 411 may have a length corresponding to the first frequency. For example, the signal of the first frequency band may be transmitted and received via the first slit 411. The second slit 412 may extend from one point of the first slit 411 in a direction different from the direction of the first slit 411. For example, the second slit 412 may extend from one point of the first slit 411 in a direction perpendicular to the first slit 411. When viewed from above the housing 410, the second slit 412 may extend in a second direction from the first location of the second side 410*b* or from the periphery of the first location and may be connected to the first slit 411. The second slit 412 may be formed in the second side 410*b* of the housing 410 and a part of the side member. The second slit 412 may have a length corresponding to the second frequency. For example, the signal of the second frequency band may be transmitted and received via the second slit 412 (or the second slit 412 and the first slit 411). Two or more slits 421 and 422 are formed in the housing 410, and thus the housing 410 may operate as an antenna radiator that resonates at two or more frequencies. The first slit 411 and the second slit 412 may form an L-shape together. The housing may include an electrically non-conductive material that fills at least part of the first slit 411 and the second slit 412.

According to an embodiment, the printed circuit board 420 may be disposed under the housing 410. Although not illustrated in FIG. 4, other components (e.g., communication circuits) of the electronic device may be disposed on the printed circuit board 420. The printed circuit board 420 may include a conductive material for transmitting an electrical signal.

According to an embodiment, the printed circuit board 420 may include a slit facing the first slit 411 or the second slit 412. According to an embodiment, the slits 421 and 422 may be formed in at least part of the region of the printed circuit board 420 corresponding to the first slit 411 and the second slit 412 of the housing 410. For example, when the printed circuit board 420 is disposed under the housing 410, the slits 421 and 422 may be formed in some regions of the printed circuit board 420 overlapping with the first slit 411 and the second slit 412 of the housing 410. The slits 421 and 422 may be formed on the printed circuit board 420, and thus the first slit 411 and the second slit 412 of the housing 410 may not overlap with the conductive material included in the printed circuit board 420, when viewed from the rear surface of the housing 410. The conductive material adjacent to the first slit 411 and the second slit 412 of the housing 410 may be removed and thus the radiation performance by the first slit 411 and the second slit 412 may not be degraded.

Figure 8:
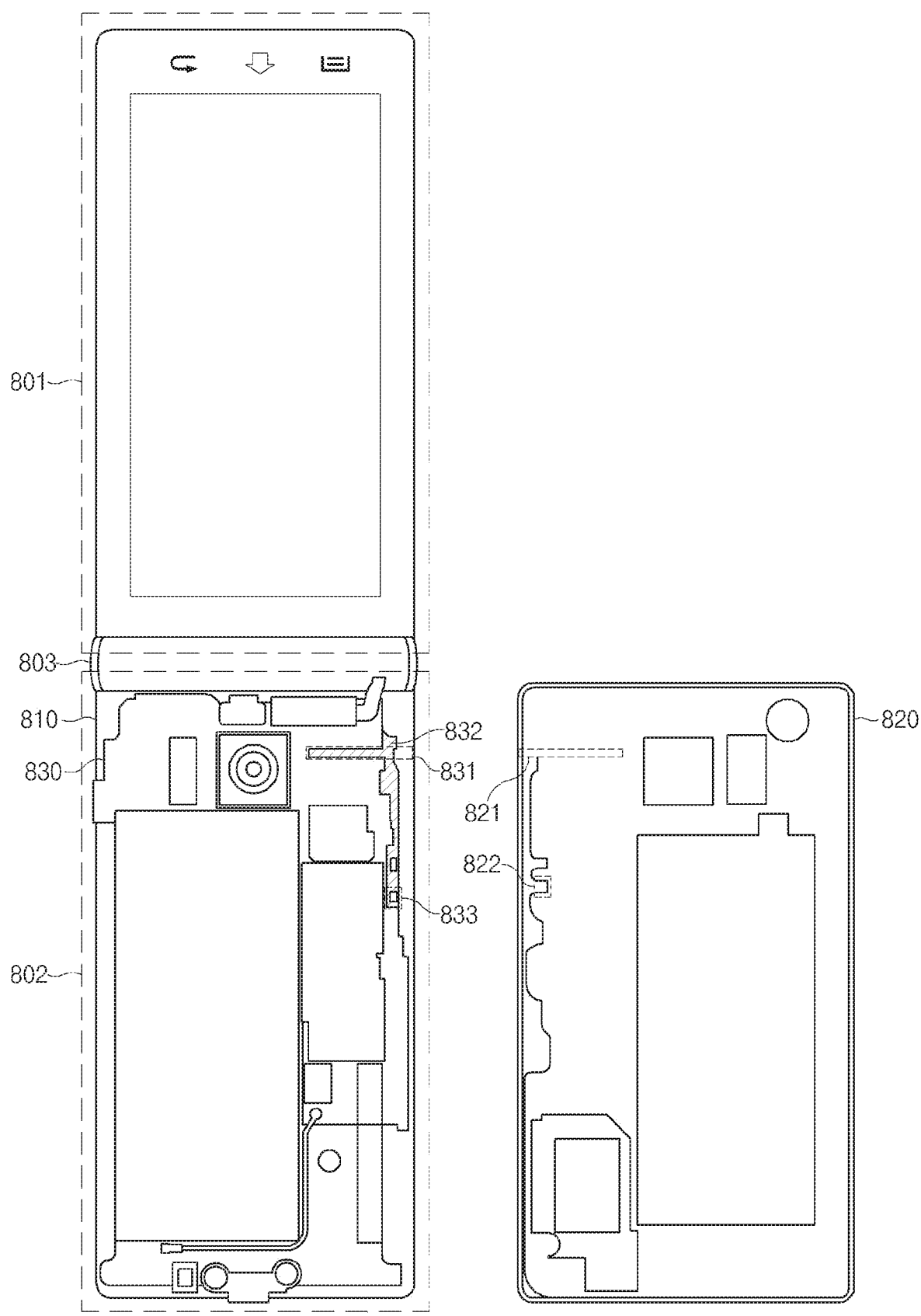
FIG. 8 is an exploded view illustrating an internal structure of an electronic device, according to an embodiment.

According to another embodiment, at least part of the region of the printed circuit board 420 corresponding to the first slit 411 and the second slit 412 of the housing 410 may be made of a non-conductive material. For example, the slits 421 and 422 of the printed circuit board 420 illustrated in FIG. 4 may be filled with a non-conductive material. The exemplary shape in which some regions of the printed circuit board 420 are made of a non-conductive material is illustrated in FIG. 8. For example, when the printed circuit board 420 is disposed under the housing 410, some regions of the printed circuit board 420 overlapping with the first slit 411 and the second slit 412 of the housing 410 may be made of a non-conductive material. For example, the region of the printed circuit board 420 corresponding to the first slit 411 and the second slit 412 may be a fill cut region. Some regions of the printed circuit board 420 may be made of a non-conductive material, and thus the first slit 411 and the second slit 412 of the housing 410 may not overlap with the conductive material included in the printed circuit board 420, when viewed from the rear surface of the housing 410. The region adjacent to the first slit 411 and the second slit 412 of the housing 410 may be made of a non-conductive material, and thus the radiation performance by the first slit 411 and the second slit 412 may not be degraded.

According to an embodiment, the feeding part 430 may be electrically connected to one point 410 of the housing 410. For example, the feeding part 430 may be electrically connected to the one point 413 of the housing 410 via the one point 423 of the printed circuit board 420. For example, the one point 423 of the printed circuit board 420 and the one point 413 of the housing 410 may be electrically connected through a connection member. For example, the feeding part 430 may be electrically connected to the processor 120 of FIG. 1, the communication interface 170 of FIG. 1, the communication module 220 of FIG. 2, the processor 210 of FIG. 2, or the like.

According to an embodiment, the feeding part 430 may feed the one point 423 of the printed circuit board 420. The electrical signal fed to the one point 423 of the printed circuit board 420 may be transmitted to the one point 413 of the housing 410 adjacent to the first slit 411 or the second slit 412 of the housing 410. For example, the electrical signal fed to the one point 423 of the printed circuit board 420 by the feeding part 430 may be transmitted to the one point 413 of the housing 410 adjacent to a region in which the first slit 411 and the second slit 412 overlap with each other.

According to an embodiment, the one point 423 (or a first conductive portion) of the printed circuit board 420 may be electrically connected to the wireless communication circuit. For example, the wireless communication circuit may be electrically connected to the one point 423 of the printed circuit board 420 through a cable including the conductive line. For example, the cable may cross the slit formed on the printed circuit board 420 when viewed from above the housing 410. When viewed from above the housing 410, the one point 423 of the printed circuit board 420 may be positioned between the first side 410a and the first slit 411 of the housing 410. The one point 413 of the printed circuit board 420 may be electrically connected to the one point 413 of the housing 410 facing the one point 423 of the printed circuit board 420. A flexible conductive member may be inserted between the one point 423 of the printed circuit board 420 and the one point 413 of the housing 410.

Figure 5:
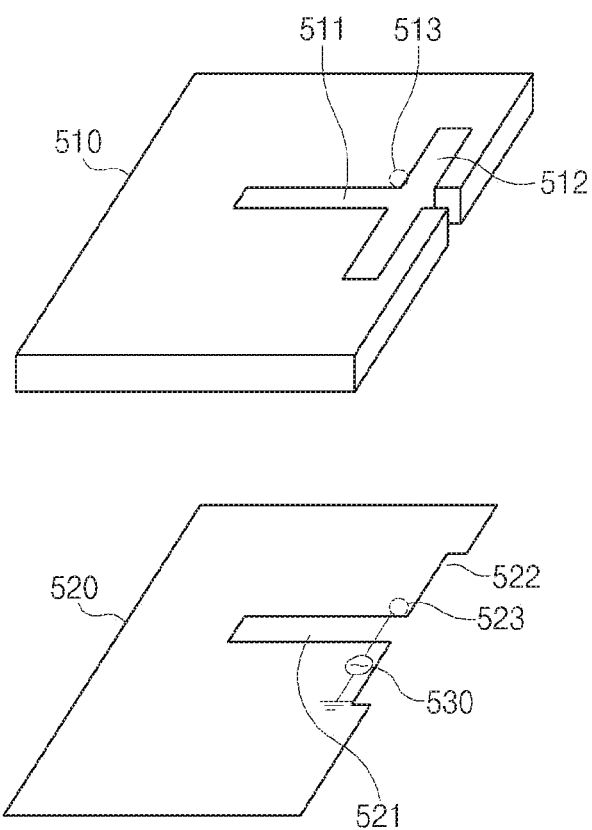
FIG. 5 illustrates housing and a printed circuit board included in an electronic device, according to an embodiment.

FIG. 5 illustrates housing and a printed circuit board included in an electronic device, according to an embodiment.

Referring to FIG. 5, an electronic device according to an embodiment may include housing 510, a printed circuit board 520, and a feeding part 530. For convenience of description, a description overlapping with the description given with reference to FIG. 4 will be omitted.

According to an embodiment, the first slit 510 and the second slit 520 may be formed in the housing 510. For example, the first slit 510 may extend in a direction perpendicular to an edge from the edge (e.g., the right edge) of the housing 510. For example, the second slit 520 may extend from one point of the first slit 510 in a first direction perpendicular to the first slit 510 and a second direction opposite to the first direction. For example, the second slit 520 may extend upward and downward from one point of the first slit 510 of the first slit 510. The center part of the second slit 520 may be intersected with the first slit 510.

According to an embodiment, the slits 521 and 522 may be formed in at least part of the region of the printed circuit board 520 corresponding to the first slit 511 and the second slit 512 of the housing 510. For example, when the printed circuit board 520 is disposed under the housing 510, the slits 521 and 522 may be formed in some regions of the printed circuit board 520 overlapping with the first slit 511 and the second slit 512 of the housing 510.

According to another embodiment, at least part of the region of the printed circuit board 520 corresponding to the first slit 511 and the second slit 512 of the housing 510 may be made of a non-conductive material. For example, the slits 521 and 522 of the printed circuit board 520 illustrated in FIG. 5 may be filled with a non-conductive material. For example, the region of the printed circuit board 520 corresponding to the first slit 510 and the second slit 520 may be a fill cut region.

According to an embodiment, the feeding part 530 may be electrically connected to one point 513 of the housing 510 via one point 523 of the printed circuit board 520. For example, the feeding part 530 may feed the one point 523 of the printed circuit board 520, and the electrical signal fed to the one point 523 of the printed circuit board 520 may be transmitted to the one point 513 of the housing 510 adjacent to a region in which the first slit 511 and the second slit 512 overlap with each other.

Figure 6:
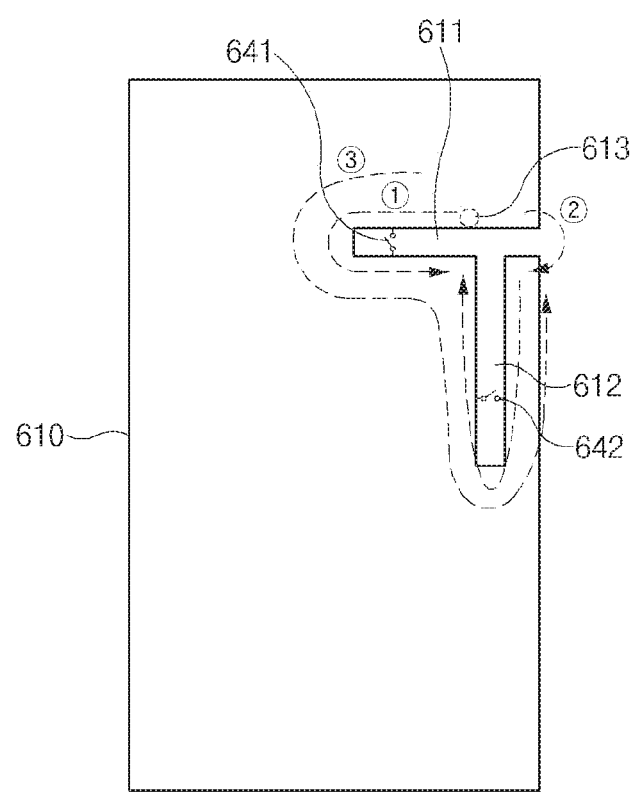
FIG. 6 illustrates a resonant current path on housing included in an electronic device, according to an embodiment.

FIG. 6 illustrates a resonant current path on housing included in an electronic device, according to an embodiment.

Referring to FIG. 6, housing 610 according to an embodiment may include a first slit 611 and a second slit 612. One point 613 of the housing 610 may be electrically connected to one point (e.g., 423 of FIG. 4) of a printed circuit board (e.g., 420 of FIG. 4) electrically connected to a feeding part (e.g., the feeding part 430 of FIG. 4).

According to an embodiment, the electrical signal fed via the feeding part may be transmitted along a first path ①, a second path ②, and/or a third path ③. The electrical signal may be transmitted along the first path ①, the second path ②, and/or the third path ③, and thus the housing 610 may operate as an antenna. For example, the electrical signal may be transmitted along the first path ①. The signal of a first frequency band among electrical signals transmitted along the first path ① may be radiated through the first slit 611. For another example, the electrical signal may be transmitted along the second path ②. The edge portion of the housing 610 divided by the first slit 611 may be coupled electrically. The signal of a second frequency band among electrical signals transmitted along the second path ② may be radiated through the second slit 612. For another example, the electrical signal may be transmitted along the third path ③. The signal of a second frequency band among electrical signals transmitted along the third path ③ may be radiated through the second slit 612 (or the first slit 611 and the second slit 612).

According to an embodiment, the housing 610 may be electrically connected to a first switch 641 and a second switch 642. For example, the first switch 641 may be electrically connected to one portion of the first slit 611. When the first switch 641 is closed, the electrical length of the first slit 611 may be shortened. The second switch 642 may be electrically connected to one portion of the second slit 612. When the second switch 642 is closed, the electrical length of the second slit 612 may be shortened. As the first switch 641 and the second switch 642 are opened and closed, the resonant frequency of the housing 610 by the first slit 611 and the second slit 612 may be changed. For example, when the first switch 641 and/or the second switch 642 is closed, the resonant frequency of the housing 610 may increase. The first switch 641 and the second switch 642 may be connected to a printed circuit board via a connection member such as C-clip or the like.

An embodiment is exemplified in FIG. 6 as the housing 610 is electrically connected to the first switch 641 and the second switch 642. However, the first switch 641 and the second switch 642 may be omitted as a selective configuration.

Figure 7:
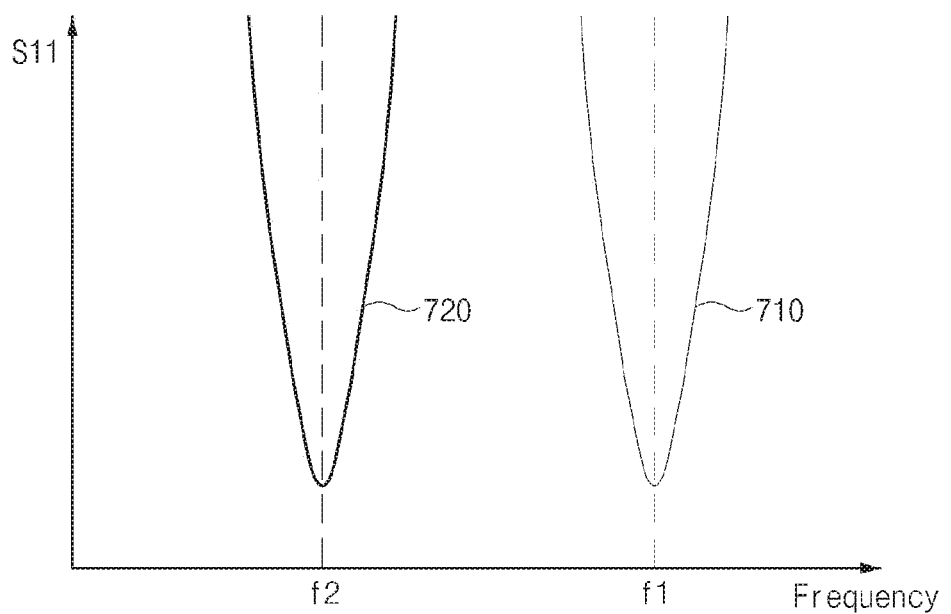
FIG. 7 is a graph illustrating a reflection coefficient according to a frequency of an antenna included in an electronic device, according to an embodiment.

FIG. 7 is a graph illustrating a reflection coefficient according to a frequency of an antenna included in an electronic device, according to an embodiment.

Referring to FIG. 7, for example, the housing 410 of the electronic device illustrated in FIG. 4 may have a low reflection coefficient at a first frequency f1 and a second frequency f2. For example, the housing 410 may resonate at the first frequency f1 and the second frequency f2. When the electronic device is a mobile device, it may be difficult for the housing 410 to resonate at a low frequency due to the limited size of the electronic device. For example, the housing 410 including only the first slit 411 may resonate at the first frequency f1 that is a relatively high frequency. As illustrated in FIG. 4, the housing 410 may resonate at the first frequency f1 and the second frequency f2 lower than the first frequency f1, by forming the second slit 412 in the housing 410. A sufficiently low reflection coefficient may appear at the first frequency f1 and the second frequency f2 by removing a part of the conductive layer of the printed circuit board to form the slit 421 in the regions of the printed circuit board 420 corresponding to the first slit 411 and the second slit 412 and feeding the first slit 411 and the second slit 412 using the single feeding part 430.

FIG. 8 is an exploded view illustrating an internal structure of an electronic device, according to an embodiment.

Referring to FIG. 8, an electronic device may be a clamshell mobile device. The electronic device may include a body part 802 and a folder part 801 that is rotatably coupled to the body part 802 by a hinge 803. The electronic device may include a front housing 810 and a rear housing 820 that surround the body part 802 of the electronic device. The electronic device may include a side member surrounding a space between the front housing 810 and the rear housing 820. According to an embodiment, the rear housing 820 and the side member may be formed integrally. The electronic device may include a touch screen display (not illustrated) that is exposed through the front housing 810. In the disclosure, the body part 802 may be referred to as the lower portion of the electronic device, and the folder part 901 may be referred to as the upper portion of the electronic device. In the disclosure, the front housing 810 may be referred to a first plate, and the rear housing 820 may be referred to a second plate.

According to an embodiment, a printed circuit board 830 may be disposed in a space between the front housing 810 and the rear housing 820. For example, the printed circuit board 830 may be disposed on the rear surface of the front housing 810. Although not illustrated in FIG. 8, an input device such as a keypad, a touch panel, or the like may be exposed through the front surface of the front housing 810 exposed to the outside. The printed circuit board 830 may include various components of the electronic device. For example, a wireless communication circuit and a processor electrically connected to the wireless communication circuit may be disposed on the printed circuit board. A second region 832 of the printed circuit board 830 may be made of a non-conductive material. A connection member may be disposed in a third region 833 of the printed circuit board 830.

According to an embodiment, the rear housing 820 may be coupled to the front housing 810. When viewed from the rear surface of the electronic device, the rear housing 820 may be disposed on the printed circuit board 830. The substantial portion of the rear housing 820 may be made of an electrical conductive material. For example, one surface of the rear housing 820 exposed to the outside may be made of metal. A slit (e.g., the first slit and the second slit) may be formed in the housing. For example, the slit may be formed in a first region 821 of the rear housing 820. When viewing the inner surface of the rear housing, a conductive material may be exposed through a second region 822 of the rear housing 820. The second region 822 of the rear housing 820 may be electrically connected to a connection member disposed in the third region 833 of the printed circuit board 830.

According to an embodiment, at least part of a first region 831 of the printed circuit board 830 corresponding to the first region 821 of the rear housing 820 in which a slit is formed may be made of a non-conductive material. For example, the second region 832 of the printed circuit board 830 corresponding to the first region 821 of the rear housing 820 may be made of a non-conductive material. For example, the second region 832 may be a fill cut region. The region adjacent to the slit of the housing may be made of a non-conductive material, and thus the radiation performance by a slit may not be degraded.

Figure 9:
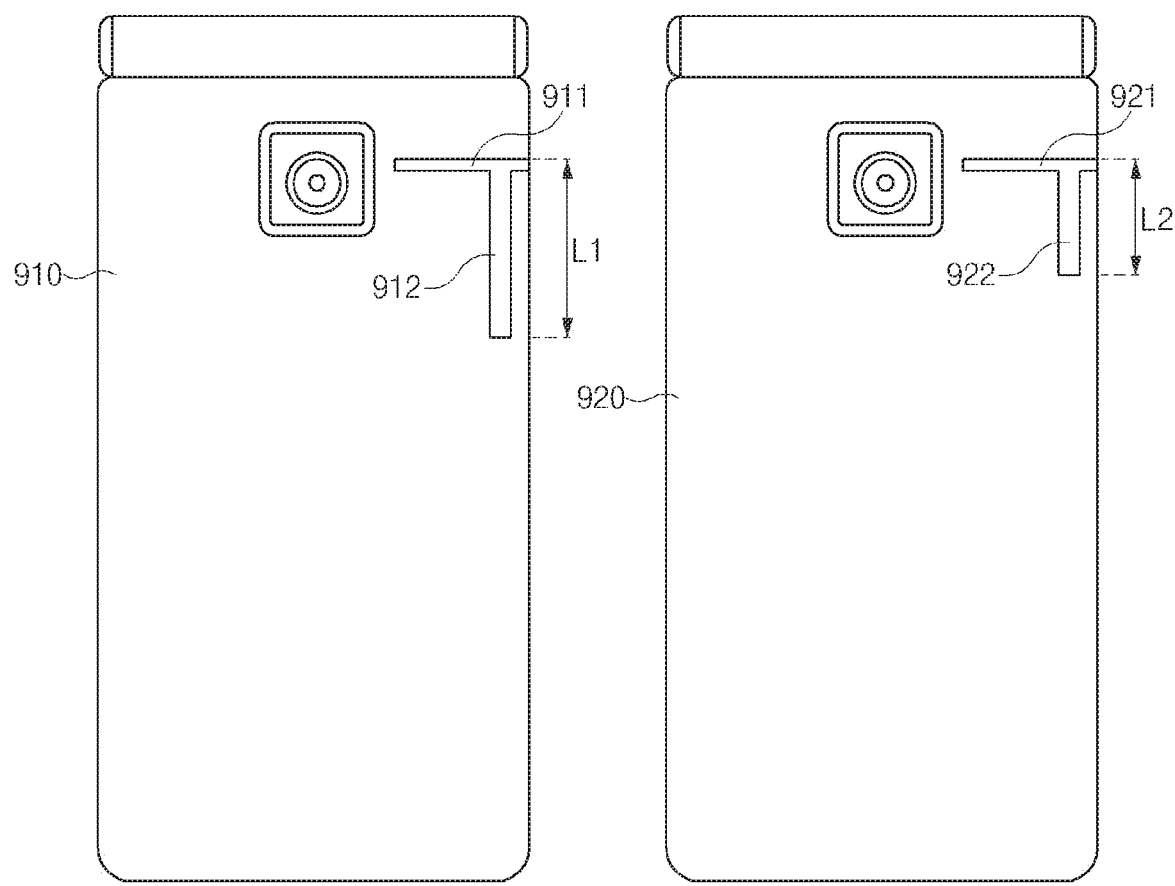
FIG. 9 is a rear view of an electronic device, according to an embodiment.

FIG. 9 is a rear view of an electronic device, according to an embodiment.

Referring to FIG. 9, housing 910 of an electronic device according to an embodiment may include a first slit 911 and a second slit 912. The signal from an electronic device may be wirelessly transmitted and received via the first slit 911 and the second slit 912. The frequency of the signal transmitted and received via the first slit 911 and the second slit 912 may be determined depending on the lengths of the first slit 911 and the second slit 912. For example, the frequency of the signal transmitted and received via the first slit 911 and the second slit 912 may be lowered as the lengths of the first slit 911 and the second slit 912 decrease. For example, a length L1 of the second slit 912 may be 20 mm.

According to various embodiments, housing 920 of an electronic device may include a third slit 921 and a fourth slit 922. The signal from an electronic device may be wirelessly transmitted and received via the third slit 921 and the fourth slit 922. The length of the third slit 921 may be the same as the length of the first slit 911. A length L2 of the fourth slit 922 may be shorter than the length L1 of the second slit 912. For example, the length L2 of the fourth slit 922 may be 15 mm. In this case, the frequency of the signal transmitted and received via the fourth slit 922 may be higher than the frequency of the signal transmitted and received via the second slit 912.

Figure 10:
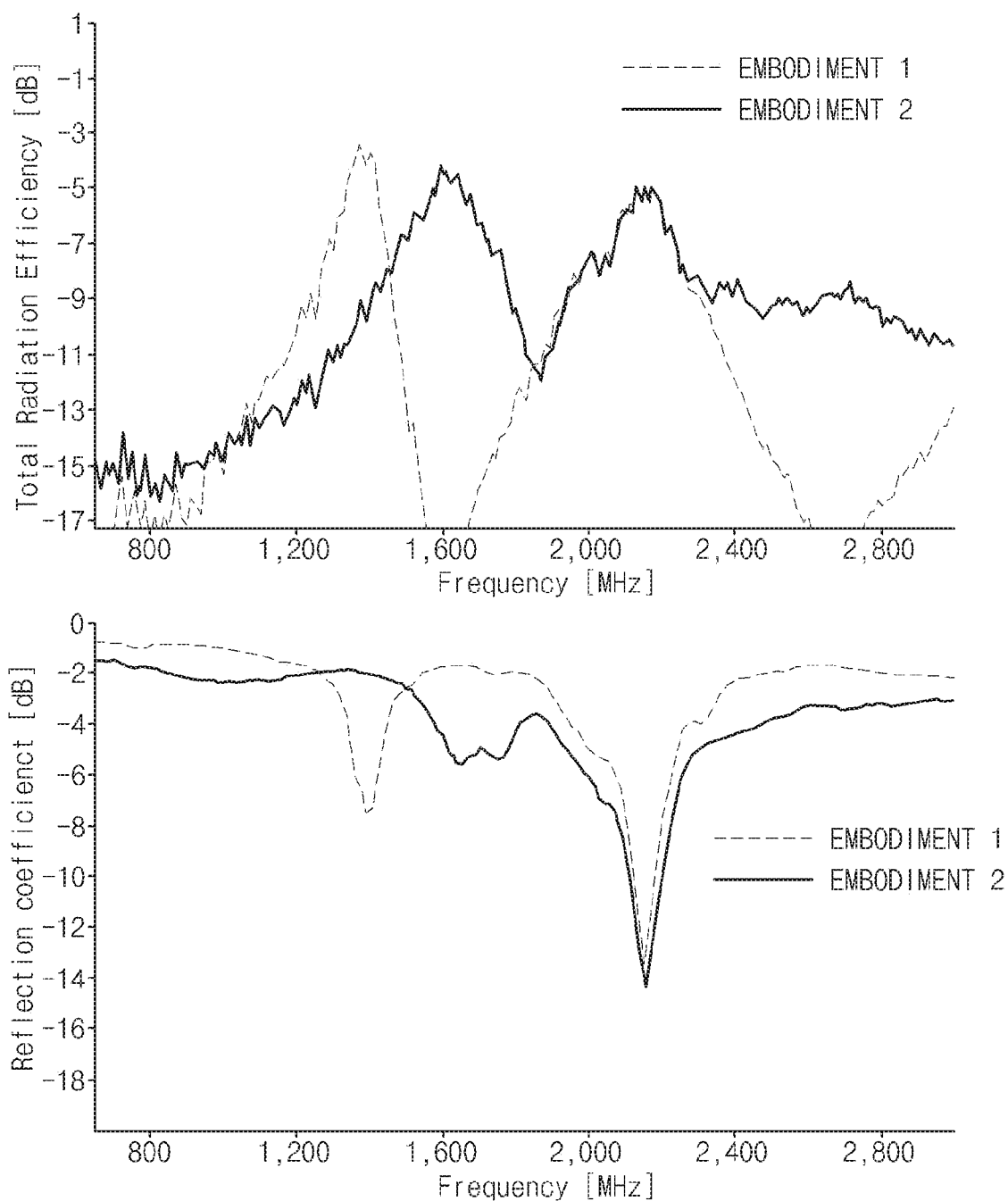
FIG. 10 is a graph illustrating total radiation efficiency and a reflection coefficient according to a frequency of an antenna included in an electronic device, according to various embodiments.

FIG. 10 is a graph illustrating total radiation efficiency and a reflection coefficient according to a frequency of an antenna included in an electronic device, according to various embodiments. The graph according to embodiment 1 may indicate the total radiation efficiency and the reflection coefficient of an antenna using the housing 910 of FIG. 9 as a radiator; the graph according to embodiment 2 may indicate the total radiation efficiency and the reflection coefficient of an antenna using the housing 920 of FIG. 9 as a radiator.

Referring to FIG. 10, the antenna according to embodiment 1 and the antenna according to embodiment 2 may resonate at 2.2 GHz in common. The resonance at 2.2 GHz may be generated by a slit (e.g., the first slit 911 or the third slit 921) of a horizontal direction.

The antenna according to embodiment 1 may resonate at 2.2 GHz and 1.4 GHz. The antenna according to embodiment 2 may resonate at 2.2 GHz and 1.6 GHz. The resonance at 1.4 GHz and 1.6 GHz may be generated by a slit (e.g., the second slit 912 or the fourth slit 922) of a vertical direction. Because the length of the second slit 912 of the antenna according to embodiment 1 is longer than the length of the fourth slit 922 of the antenna according to embodiment 2, the resonant frequency of the antenna according to embodiment 2 may be higher than the resonant frequency of the antenna according to embodiment 1. The resonant frequency of another frequency band may be adjusted while the performance at 2.2 GHz is maintained, by adjusting the length of the slit of the vertical direction.

Figure 11:
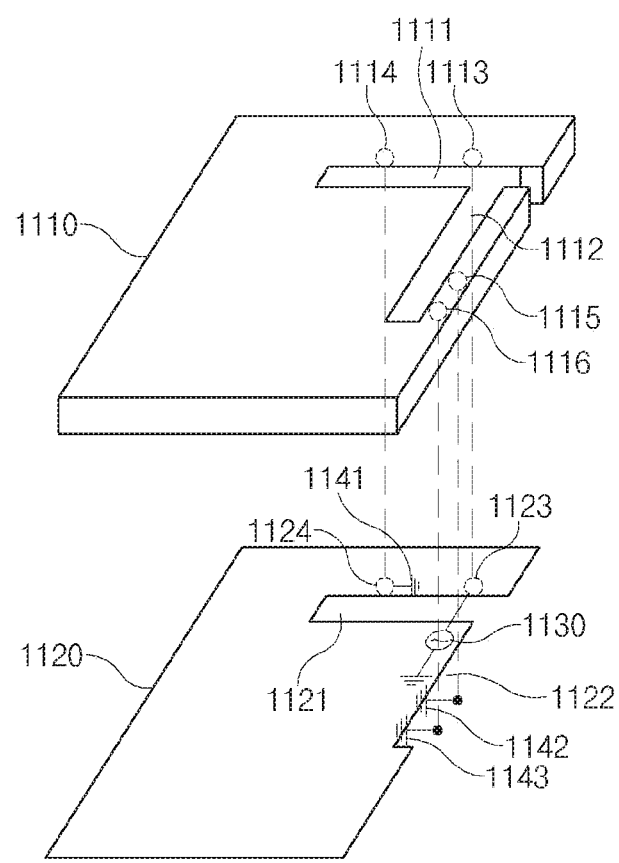
FIG. 11 illustrates housing and a printed circuit board included in an electronic device, according to various embodiments

FIG. 11 illustrates housing and a printed circuit board included in an electronic device, according to various embodiments Referring to FIG. 11, an electronic device according to an embodiment may include housing 1110, a printed circuit board 1120, a feeding part 1130, a first ground part 1141, a second ground part 1142, and a third ground part 1143.

According to various embodiments, the housing 1110 may include a first slit 1111 and a second slit 1112. The printed circuit board 1120 may include a slit 1121 or 1122. The feeding part 1130 may be electrically connected to a point 1113 of the housing 1110 via a point 1123 of the printed circuit board 1120. The feeding part 1130 may feed the one point 1123 of the printed circuit board 1120. The fed electrical signal may be transmitted to the point 1113 of the housing 1110. Because the housing 1110, the printed circuit board 1120, and the feeding part 1130 of FIG. 11 are similar to the housing 410, the printed circuit board 420, and the feeding part 430 of FIG. 4, redundant descriptions will be omitted.

According to various embodiments, one or more points 1114, 1115, and 1116 of the housing 1110 adjacent to the first slit 1111 or the second slit 1112 may be electrically connected to a ground layer (not illustrated). For example, the one or more points 1114, 1115, and 1116 of the housing 1110 may be connected to a ground layer via the first ground part 1141, the second ground part 1142, and the third ground part 1143, respectively.

The first ground part 1141, the second ground part 1142, and the third ground part 1143 may be electrically connected to one or more switches (not illustrated). The first ground part 1141, the second ground part 1142, and the third ground part 1143 may be selectively connected to the ground layer via switches. For example, a part of the first ground part 1141, the second ground part 1142, and the third ground part 1143 may be connected to the ground layer depending on an operation of a switch. Alternatively, all of the first ground part 1141, the second ground part 1142, and the third ground part 1143 may be connected to the ground layer. Alternatively, all of the first ground part 1141, the second ground part 1142, and the third ground part 1143 may not be connected to the ground layer. For example, a part of the first point 1114, the second point 1115, and the third point 1116 of the housing 1110 may be connected to the ground layer. Alternatively, all of the first point 1114, the second point 1115, and the third point 1116 may be connected to the ground layer. Alternatively, all of the first point 1114, the second point 1115, and the third point 1116 may not be connected to the ground layer.

According to an embodiment, the switch may be controlled by a processor (e.g., the processor 120 of FIG. 1, the communication interface 170 of FIG. 1, the processor 210 of FIG. 2, or the communication module 220 of FIG. 2). For example, the processor may be a communication processor or an application processor.

According to an embodiment, the processor may control the switch such that the housing 1110 resonates at a targeted frequency. For example, the processor may identify the communication environment of the electronic device. The processor may set a target frequency based on the communication environment of the electronic device. The resonant frequency of the housing 1110 may be changed depending on the point 1114, 1115, and/or 1116 at which the housing 1110 is connected to the ground layer. The processor may or may not connect the first point 1114, the second point 1115, and/or the third point 1116 to the ground layer such that the housing 1110 resonates at the target frequency by controlling the switch.

According to an embodiment, the housing 1110 may be grounded via the one or more points 1114, 1115, and 1116. The housing 1110 may be fed via the one point 1113 of the housing 1110.

Figure 12:
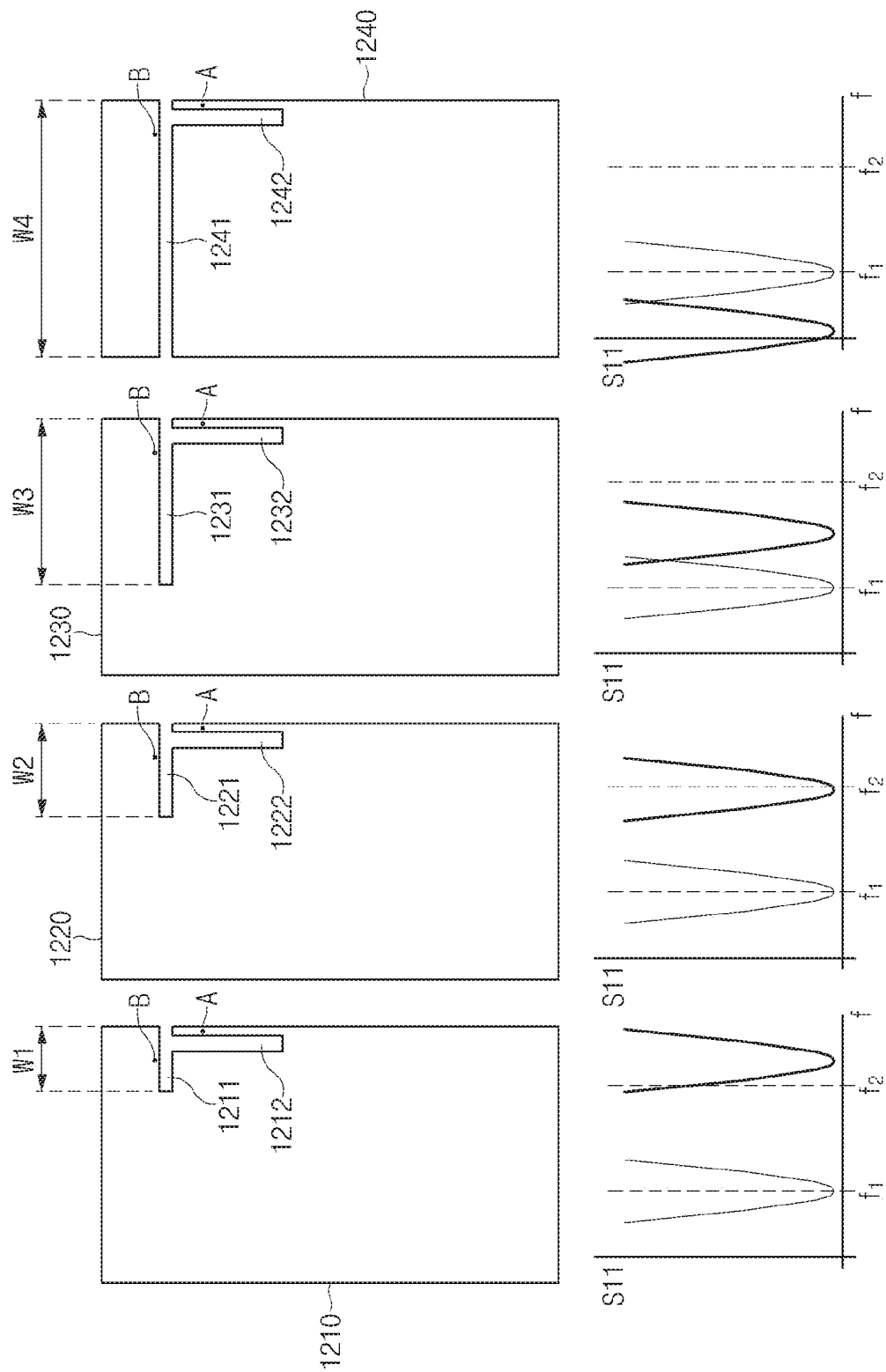
FIG. 12 illustrates housings included in an electronic device and a reflection coefficient according to frequencies corresponding to each of housings, according to various embodiments.

FIG. 12 illustrates housings included in an electronic device and a reflection coefficient according to frequencies corresponding to each of housings, according to various embodiments.

Referring to FIG. 12, the lengths of slits 1212, 1222, 1232, and 1242 of the vertical direction formed in housings 1210, 1220, 1230, and 1240 may be the same as one another. The lengths of slits 1211, 1221, 1231, and 1241 of the horizontal direction formed in the housings 1210, 1220, 1230, and 1240 may be different from one another. For example, the length W1 of the slit 1211 may be shorter than the length W2 of the slit 1221; the length W2 of the slit 1221 may be shorter than the length W3 of the slit 1231; and the length W3 of the slit 1231 may be shorter than the length W4 of the slit 1241. The slit 1241 may extend from an edge of the housing 1240 to the opposite edge. Although not illustrated in FIG. 12, the length of the slit of the horizontal direction or the fill cut region of the horizontal direction, which is formed in a printed circuit board included in the housings 1210, 1220, 1230, and 1240 may be the same as the length W2 of the slit 1221.

According to various embodiments, the resonant frequency may be changed when the length of the slit 1211, 1221, 1231, or 1241 formed in the housing is different from the length of a slit (not illustrated) that is formed in the printed circuit board so as to correspond to the slit 1211, 1221, 1231, or 1241.

According to various embodiments, the housings 1210, 1220, 1230, and 1240 may resonate at a frequency f1 in common. The resonance at the frequency f1 may be generated by the slits 1212, 1222, 1232, and 1242 of the vertical direction. The housings 1210, 1220, 1230, and 1240 may resonate at another frequency other than the frequency f1 by the slit 1211, 1221, 1231, and 1241 of the horizontal direction. Other resonant frequencies of the housings 1210, 1220, 1230, and 1240 may be changed depending on the lengths of the slits 1211, 1221, 1231, and 1241 of the horizontal direction.

For example, the housing 1220 may resonate at a frequency f2. For another example, the housing 1210 in which the length W1 of the slit 1211 of the horizontal direction is shorter than the housing 1220, may resonate at a frequency higher than the frequency f2. For another example, the housing 1230 in which the length W3 of the slit 1231 of the horizontal direction is longer than the housing 1220, may resonate at a frequency lower than the frequency f2. For another example, the housing 1240 in which the length W4 of the slit 1241 of the horizontal direction is longer than the housing 1230, may resonate at a frequency lower than the frequency f1.

According to an embodiment, the housings 1210, 1220, 1230, and 1240 may receive an electrical signal from the printed circuit board (not illustrated). For example, the housings 1210, 1220, 1230, and 1240 may receive an electrical signal through a point A or a point B. For example, when the electrical signal is supplied via the point A, the resonant frequency by the slit 1211, 1221, 1231 or 1241 of the horizontal direction may be changed depending on the length W1, W2, W3 or W4 of the slit 1211, 1221, 1231 or 1241 of the horizontal direction, and the resonant frequency by the slit 1212, 1222, 1232 or 1242 of vertical direction may be maintained. For another example, when the electrical signal is supplied via the point B, the resonant frequency by the slit 1211, 1221, 1231 or 1241 of the horizontal direction and the slit 1212, 1222, 1232 or 1242 of vertical direction may be changed depending on the length W1, W2, W3 or W4 of the slit 1211, 1221, 1231 or 1241 of the horizontal direction.

Figure 13:
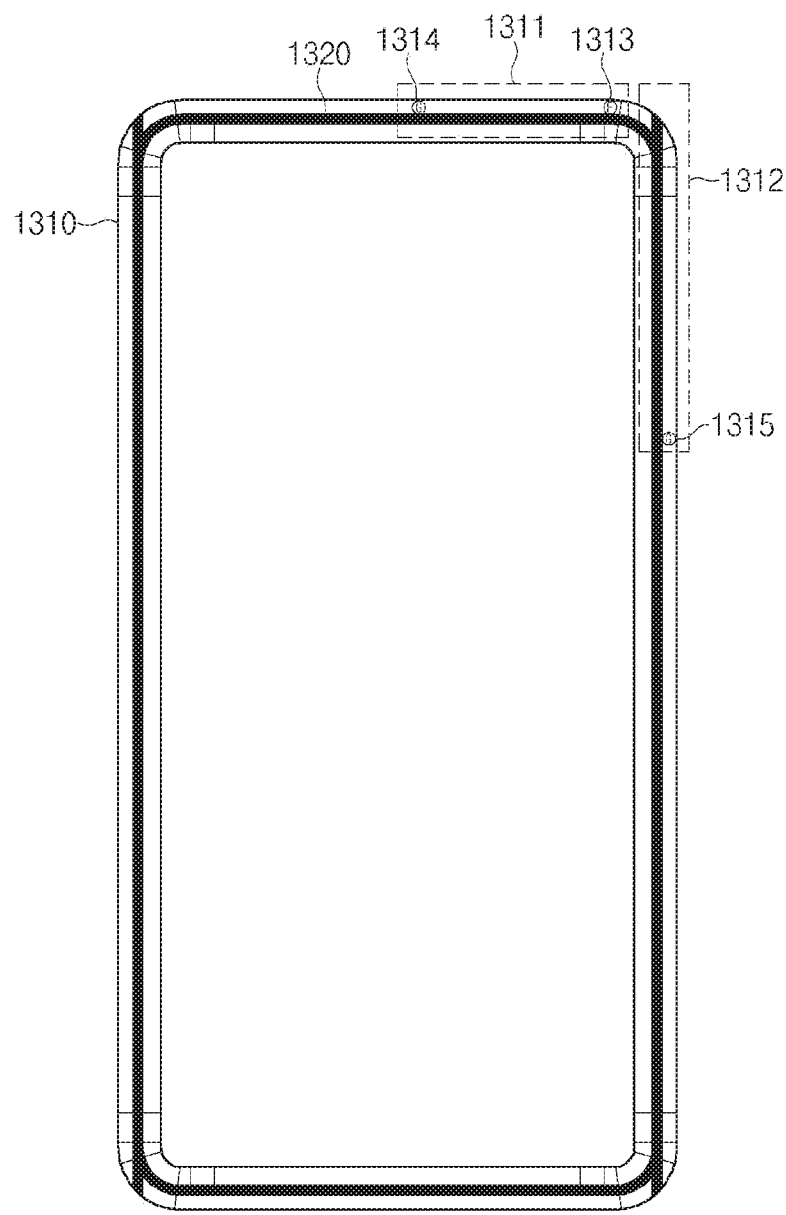
FIG. 13 is a rear view of an electronic device, according to an embodiment.

FIG. 13 is a rear view of an electronic device, according to an embodiment.

Referring to FIG. 13, an electronic device may include housing 1310 and a non-conductive member 1320. The housing 1310 may be the back cover of an electronic device. The slit formed in the housing 1310 may be filled by the non-conductive member 1320.

According to an embodiment, a slit may be formed in a first region 1311 of the housing 1310. The slit may be filled by the non-conductive member 1320. The housing 1310 may receive an electrical signal through a first point (e.g., the point of a right top) 1313 of the first region 1311. The housing 1310 may be grounded through a second point (e.g., the point of a left top) 1314 of the first region 1311. The signal fed through the first point 1313 may be radiated via the slit in the first region 1311.

According to an embodiment, a slit may be formed in the second region 1312 of the housing 1310. The slit may be filled by the non-conductive member 1320. The housing 1310 may be grounded through a third point (e.g., the point of a left bottom) 1315 of the second region 1312. The electrical signal supplied via the first point 1313 may be transmitted to the right end of the housing 1310 by coupling.

The signal supplied via the first point 1313 may be radiated via the slit in the second region 1312.

Figure 14:
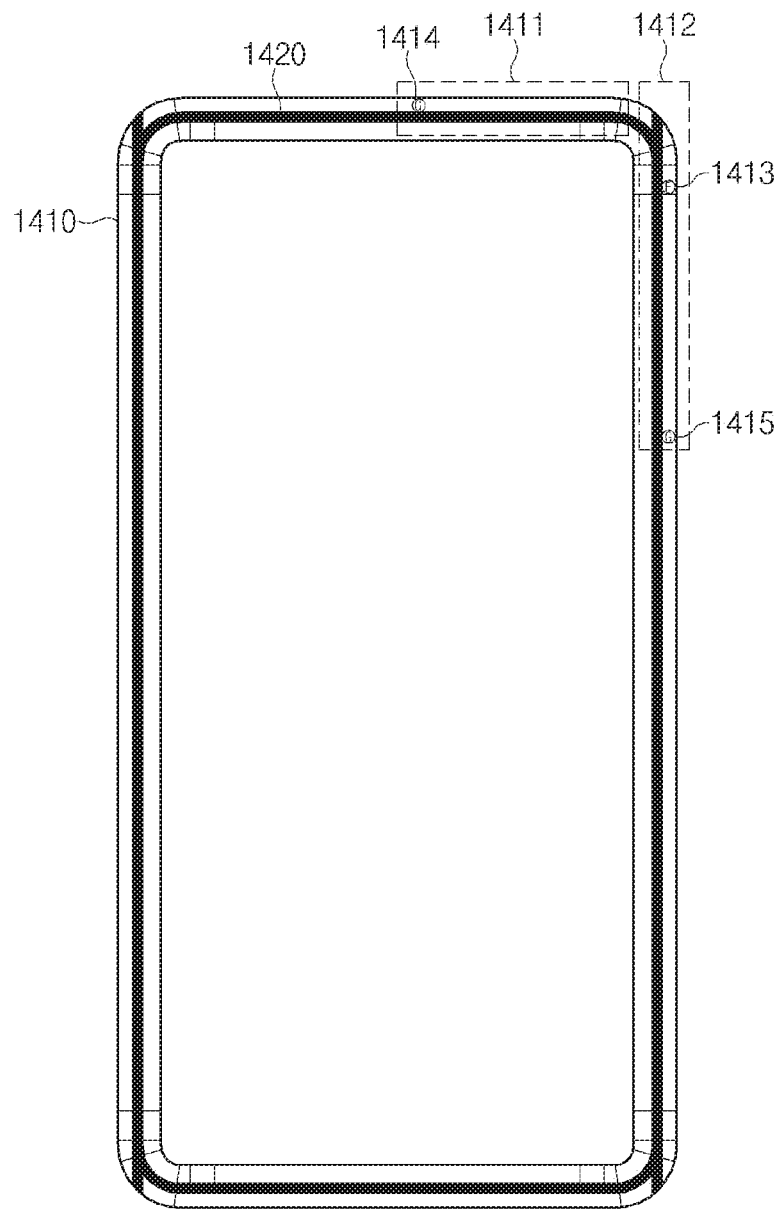
FIG. 14 is a rear view of an electronic device, according to an embodiment.

FIG. 14 is a rear view of an electronic device, according to an embodiment.

Referring to FIG. 14, an electronic device may include housing 1410 and a non-conductive member 1420. The housing 1410 may be the back cover of the electronic device. The slit formed in the housing 1410 may be filled by the non-conductive member 1420.

According to an embodiment, a slit may be formed in a second region 1412 of the housing 1410. The slit may be filled by the non-conductive member 1420. The housing 1410 may receive an electrical signal through a point 1413 of a right top of the region 1412. The housing 1410 may be grounded through a point 1415 of a left bottom of the region 1412. The signal fed through the point 1413 may be radiated via the slit in the region 1412.

According to an embodiment, a slit may be formed in a first region 1411 of the housing 1410. The slit may be filled by the non-conductive member 1420. The housing 1410 may be grounded through a point 1414 of a left top of the first region 1411. The electrical signal supplied via the point 1413 may be transmitted to the top end of the housing 1410 by coupling. The electrical signal supplied via the second point 1413 may be radiated via the slit in the first region 1411.

Figure 15:
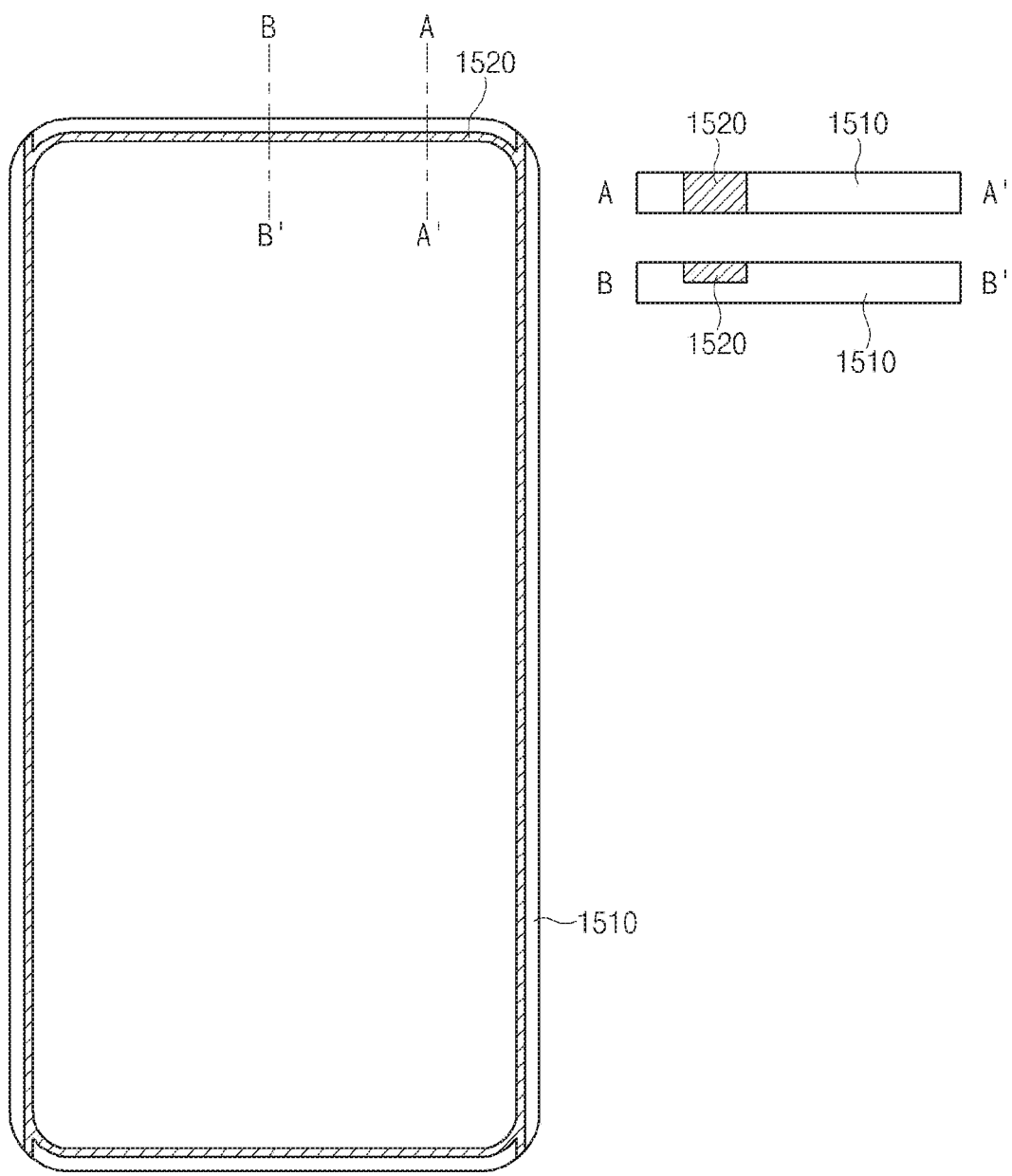
FIG. 15 is a sectional view and a rear view of housing included in an electronic device, according to an embodiment.

FIG. 15 is a sectional view and a rear view of housing included in an electronic device, according to an embodiment.

Referring to FIG. 15, an electronic device may include housing 1510 and a non-conductive member 1520. The housing 1510 may be the back cover of the electronic device.

According to an embodiment, referring to a cross-sectional view of the housing 1510 according to A-A', a slit of a horizontal direction may be formed in the housing 1510. The slit of a horizontal direction formed in the housing 1510 may be filled with a non-conductive member 1520.

According to an embodiment, referring to a cross-sectional view of the housing 1510 according to B-B', the housing 1510 may include at least one portion (e.g., a B-B' adjacent region) that is not physically separated by a slit of the horizontal direction. The at least one portion, which is not physically separated and which is included in the housing 1510 may be filled with the non-conductive member 1520.

Only the slit of the horizontal direction formed in the housing 1510 is illustrated in FIG. 15. However, the slit of the vertical direction may be formed in the housing 1510, and the slit of the vertical direction may be filled with the non-conductive member 1520.

Figure 16:
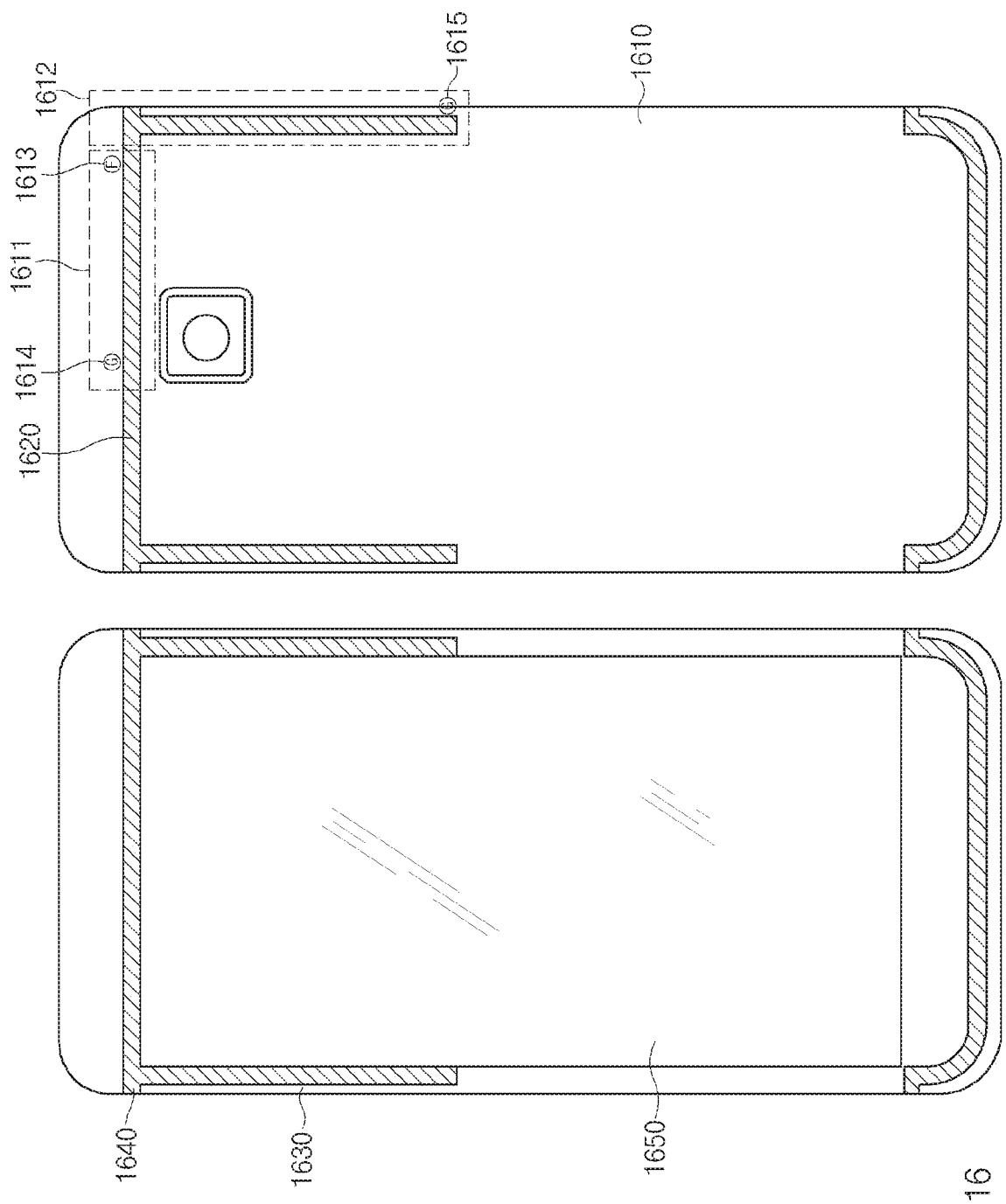
FIG. 16 is a front view and a rear view of an electronic device, according to an embodiment.

FIG. 16 is a front view and a rear view of an electronic device, according to an embodiment.

Referring to FIG. 16, an electronic device according to an embodiment may include first housing 1610, a first non-conductive member 1620, second housing 1630, a second non-conductive member 1640, and a display 1650.

According to an embodiment, the first housing 1610 may surround the lower portion of the electronic device. The first housing 1610 may be configured to resonate at a first frequency and a second frequency. For example, a first slit (e.g., a slit of the horizontal direction) having a length associated with the first frequency may be formed in a first region 1611 of the first housing 1610. The first slit may be filled with the first non-conductive member 1620. The first housing 1610 may receive an electrical signal through a point 1613 of a right top of the first region 1611. The first housing 1610 may be grounded through a point 1614 of a left top of the first region 1611. A second slit (e.g., a slit of the vertical direction) extending from one point of the first slit in a different direction may be formed in a second region 1612 of the first housing 1610. The second slit may have a length associated with the second frequency. The second slit may be filled with the first non-conductive member 1620. The first housing 1610 may be grounded through a point 1615 of a right bottom of the second region 1612.

According to an embodiment, the second housing 1630 may surround the upper portion of the electronic device. The second housing 1630 may surround the periphery of the display 1650 disposed on the electronic device. According to an embodiment, the second housing 1630 may be configured to resonate at a first frequency and a second frequency. For example, a third slit (e.g., a slit of the horizontal direction) having a length associated with the first frequency may be formed in the second housing 1630. The third slit may be filled with the second non-conductive member 1640. A fourth slit (e.g., a slit of the vertical direction) extending from one point of the third slit in a different direction may be formed in the second housing 1630. The fourth slit may have a length associated with the second frequency. The fourth slit may be filled with the second non-conductive member 1640. For example, the third slit and the fourth slit may be formed at locations symmetrical to locations at which the first slit and the second slit formed in the first housing 1610 are formed. The second housing 1630 may be fed or grounded through the point of the second housing 1630 symmetrical to points 1613, 1614, and 1615 of the first housing 1610.

Figure 17:
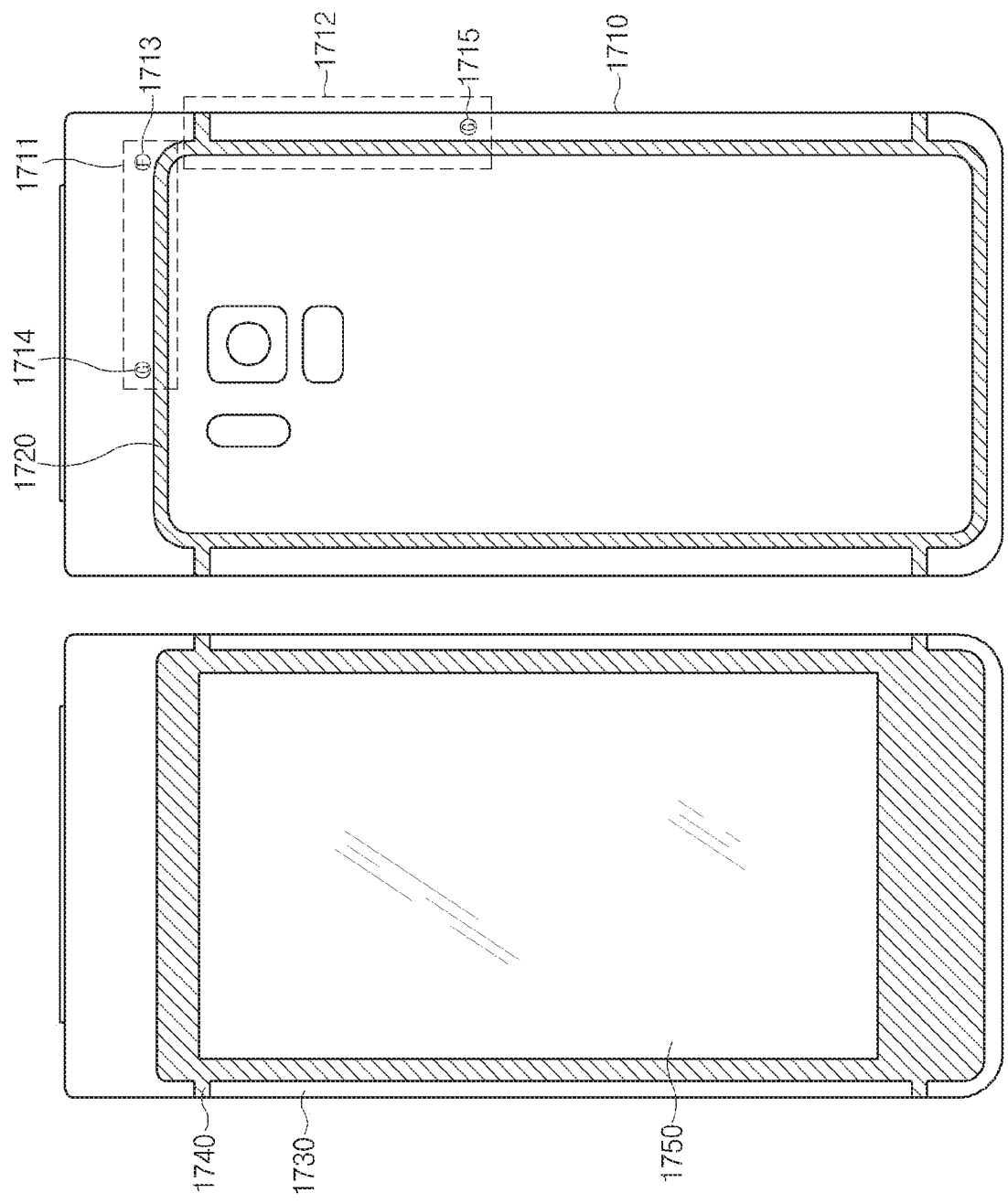
FIG. 17 is a front view and a rear view of an electronic device, according to an embodiment.

FIG. 17 is a front view and a rear view of an electronic device, according to an embodiment.

Referring to FIG. 17, an electronic device may include first housing 1710, a first non-conductive member 1720, second housing 1730, a second non-conductive member 1740, and a display 1750. Since the first housing 1710, the first non-conductive member 1720, the second housing 1730, the second non-conductive member 1740, and the display 1750 of FIG. 17 are components similar to the first housing 1610, the first non-conductive member 1620, the second housing 1630, the second non-conductive member 1640, and the display 1650 of FIG. 16, redundant descriptions will be omitted.

According to an embodiment, a first slit (e.g., a slit of the horizontal direction) may be formed in a first region 1711 of the first housing 1710. The first slit may be formed as a curve. For example, after the first slit extends from the left edge of the first housing 1710 in the right direction and then extends to the upper left as a curve, the first slit extends in the left direction.

According to an embodiment, a second slit (e.g., a slit of the vertical direction) may be formed in a second region 1712 of the first housing 1710. The second slit may extend downward from a point where the first slit is bent. An embodiment is exemplified in FIG. 17 as the second slit extends along a straight line. However, an embodiment is not limited thereto. The second slit may extend along a curve. The first slit and the second slit may be filled with the first non-conductive member 1720.

According to an embodiment, a third slit and a fourth slit extending from one point of the third slit in a different direction may be formed in the second housing 1730. The third slit and/or the fourth slit may extend along a straight line or may extend along a curve. For example, the third slit and the fourth slit may be formed at locations symmetrical to locations at which the first slit and the second slit formed in the first housing 1710 are formed. The third slit and the fourth slit may be filled with the second non-conductive member 1740.

According to an embodiment, an electronic device may include a housing in which a first slit configured to resonate at a first frequency and a second frequency and having a length associated with the first frequency and a second slit extending from one point of the first slit in a direction different from the first slit and having a length associated with the second frequency are formed, a printed circuit board, which is disposed under the housing and in which at least part of a region corresponding to the first slit and the second slit is made of a non-conductive material, and a feeding part feeding through one point of the housing adjacent to the first slit or the second slit.

According to an embodiment, the first slit may extend from an edge of the housing in a direction perpendicular to the edge, and the second slit may extend in a direction perpendicular to the first slit.

According to an embodiment, the second slit may extend from one point of the first slit in a first direction perpendicular to the first slit and in a second direction opposite to the first direction.

According to an embodiment, the feeding part may feed through one point of the housing adjacent to a region in which the first slit and the second slit overlap.

According to an embodiment, the first slit may extend from an edge of the housing to an opposite edge.

According to an embodiment, the electronic device may further include a non-conductive member filling the first slit and the second slit.

According to an embodiment, the electronic device may further include a ground layer electrically connected to one or more points of the housing adjacent to the first slit or the second slit.

According to an embodiment, the electronic device may further include a ground layer electrically connected to a plurality of points of the housing adjacent to the first slit or the second slit, one or more switches interposed between the ground layer and each of the plurality of points, and a processor configured to control the one or more switches. The processor may be configured to control the one or more switches such that the housing resonates at a targeted frequency.

According to an embodiment, the housing may be fed through only the one point of the housing.

According to an embodiment, the region corresponding to the first slit and the second slit of the printed circuit board may be a fill cut region.

According to an embodiment, an electronic device may include a housing in which a first slit configured to resonate at a first frequency and a second frequency and having a length associated with the first frequency and a second slit extending from one point of the first slit in a direction different from the first slit and having a length associated with the second frequency are formed, a printed circuit board, which is disposed under the housing and in which a slit is formed in at least part of a region corresponding to the first slit and the second slit, and a feeding part feeding through one point of the housing adjacent to the first slit or the second slit.

According to an embodiment, a clamshell mobile device may include first housing, which surrounds a lower portion of the clamshell mobile device and in which a first slit configured to resonate at a first frequency and a second frequency and having a length associated with the first frequency and a second slit extending from one point of the first slit in a direction different from the first slit and having a length associated with the second frequency are formed, second housing surrounding an upper portion of the clamshell mobile device, a printed circuit board, which is disposed under the first housing and in which at least part of a region corresponding to the first slit and the second slit is made of a non-conductive material, and a feeding part feeding through one point of the first housing adjacent to the first slit or the second slit.

According to an embodiment, a third slit resonating at the first frequency and the second frequency and having a length associated with the first frequency in the second housing and a fourth slit extending in a direction different from the first slit from one point of the first slit and having a length associated with the second frequency may be formed in the second housing.

According to an embodiment, a portable electronic device may include a housing including a first plate, a second plate facing in a direction opposite to the first plate, and a side member surrounding a space between the first plate and the second plate, a printed circuit board (PCB) positioned inside the space between the first plate and the second plate, a processor positioned on the PCB, and a wireless communication circuit positioned in the space and electrically connected to the processor. A substantial portion of the second plate may be made of an electrical conductive material. The second plate may have a rectangular shape, the rectangular shape including a first side extending in a first direction and having a first length, a second side extending in a second direction perpendicular to the first direction and having a second length longer than the first length, a third side extending in the first direction to be parallel to the first side and having the first length, and a fourth side extending in the second direction to be parallel to the second side and having the second length. The second plate may include a first slit extending from a first location of the second side or from a periphery of the first location in the first direction between the first side and the third side when viewed from above the second plate, a second slit extending from the first location of the second side or from the periphery of the first location in the second direction when viewed from above the second plate and connected to the first slit, and an electrical non-conductive material configured to fill at least part of the first slit or the second slit. The PCB may include a slit facing the first slit of the second plate. The wireless communication circuit may be electrically connected to a first conductive portion on the PCB. The first conductive portion may be disposed, at a periphery of the second side of the second plate and between the first side of the second plate and the first slit, when viewed from above the second plate, and the first conductive portion may be electrically connected to one point of the second plate facing the first conductive portion of the PCB.

According to an embodiment, the portable electronic device may further include a cable including a conductive line electrically connecting a wireless communication circuit to a first conductive portion.

According to an embodiment, the cable may cross the slit of the PCB when viewed from above the second plate.

According to an embodiment, the portable electronic device may further include a touch screen display exposed through the first plate.

According to an embodiment, the portable electronic device may further include a flexible conductive member inserted between the first conductive portion of the PCB and the one point of the second plate.

According to an embodiment, the first slit and the second slit of the second plate may form an L-shape together.

According to an embodiment, the second slit of the second plate may be formed by a part of the second side of the second plate and the side member.

The term "module" used in this disclosure may include a unit composed of hardware, software and firmware and may be interchangeably used with the terms "unit", "logic", "logical block", "part" and "circuit". The "module" may be an integrated part or may be a minimum unit for performing one or more functions or a part thereof. The "module" may be implemented mechanically or electronically and may include at least one of an application-specific IC (ASIC) chip, a field-programmable gate array (FPGA), and a programmable-logic device for performing some operations, which are known or will be developed. At least a part of an apparatus (e.g., modules or functions thereof) or a method (e.g., operations) according to various embodiments may be, for example, implemented by instructions stored in computer-readable storage media (e.g., the memory 130) in the form of a program module. The instruction, when executed by a processor (e.g., the processor 120), may cause the processor to perform a function corresponding to the instruction. A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and an internal memory. Also, the one or more instructions may contain a code made by a compiler or a code executable by an interpreter. A module or a program module according to various embodiments may include at least one of the above components, or a part of the above components may be omitted, or other components may be further included. Operations performed by a module, a program module, or other components according to various embodiments may be executed sequentially, in parallel, repeatedly, or in a heuristic method or some operations may be executed in different sequences or may be omitted. Alternatively, other operations may be added.

What is claimed is:

1. An electronic device comprising:
   a housing comprising a first slit extending in a first direction and having a length corresponding to a first frequency and a second slit extending, from a first point of the first slit, in a second direction different from the first slit and having a length corresponding to a second frequency, the housing being configured to resonate at the first frequency and the second frequency by the first slit and the second slit;
   a printed circuit board disposed in the housing and in which at least a part of a region corresponding to the first slit and the second slit is made of a non-conductive material; and
   a feeding part disposed on the printed circuit board and configured to feed through one point of the housing, the one point being adjacent to the first point where the first slit is intersected with the second slit.

2. The electronic device of claim 1,
   wherein the first slit extends from an edge of the housing in the first direction perpendicular to the edge, and
   wherein the second slit extends in the second direction perpendicular to the first slit direction.

3. The electronic device of claim 1, wherein the second slit extends from the first point of the first slit in the second direction perpendicular to the first direction and in a third direction opposite to the second direction.

4. The electronic device of claim 1, wherein the first slit extends from an edge of the housing to an opposite edge of the housing.

5. The electronic device of claim 1, further comprising:
a non-conductive member filling the first slit and the second slit.

6. The electronic device of claim 1, further comprising:
a ground layer electrically connected to one or more points of the housing adjacent to the first slit or the second slit.

7. The electronic device of claim 1, further comprising:
a ground layer electrically connected to a plurality of points of the housing adjacent to the first slit or the second slit;
one or more switches interposed between the ground layer and the plurality of points; and
a processor configured to control the one or more switches,
wherein the processor is further configured to:
control the one or more switches such that the housing resonates at a targeted frequency.

8. The electronic device of claim 1, wherein the housing is fed through only the one point of the housing.

9. The electronic device of claim 1, wherein the region corresponding to the first slit and the second slit of the printed circuit board is a fill cut region.

10. The electronic device of claim 1,
wherein the electronic device includes a body part, a hinge connected to the body part, and a folder part rotatably coupled to the body part by the hinge, and
wherein the housing covers a rear surface of the body part.

11. The electronic device of claim 1, wherein the first slit is formed in a first region of the housing and configured to receive an electrical signal through a point of a right top of the first region.

12. The electronic device of claim 11, wherein the housing is grounded through a point of a left top of the first region.

13. An electronic device comprising:
a housing configured to resonate at a first frequency and a second frequency and comprising a first slit extending in a first direction and having a length corresponding to the first frequency and a second slit extending, from a first point of the first slit, in a second direction different from the first slit and having a length corresponding to the second frequency;
a printed circuit board disposed inside the housing and in which a slit is formed in at least part of a region corresponding to the first slit and the second slit; and
a feeding part disposed on the printed circuit board and configured to feed through one point of the housing, the one point being adjacent to the first point where the first slit is intersected with the second slit.

14. The electronic device of claim 13,
wherein the electronic device includes a body part, a hinge connected to the body part, and a folder part rotatably coupled to the body part by the hinge, and
wherein the housing covers a rear surface of the body part.

15. A portable electronic device comprising:
a housing including a first plate, a second plate facing in a direction opposite to the first plate, and a side member surrounding a space between the first plate and the second plate, wherein a substantial portion of the second plate is made of an electrically conductive material;
a printed circuit board (PCB) positioned inside the space between the first plate and the second plate;
a processor positioned on the PCB; and
a wireless communication circuit positioned in the space and electrically connected to the processor,
wherein the second plate has a rectangular shape, the rectangular shape including:
a first side extending in a first direction and having a first length;
a second side extending in a second direction perpendicular to the first direction and having a second length longer than the first length;
a third side extending in the first direction to be parallel to the first side and having the first length; and
a fourth side extending in the second direction to be parallel to the second side and having the second length,
wherein the second plate includes:
a first slit extending from a first location of the second side or from a periphery of the first location in the first direction between the first side and the third side when viewed from above the second plate,
a second slit extending from the first location of the second side or from the periphery of the first location in the second direction when viewed from above the second plate and connected to the first slit, and
an electrical non-conductive material configured to fill at least part of the first slit or the second slit,
wherein the PCB includes a slit facing the first slit of the second plate,
wherein the wireless communication circuit is electrically connected to a first conductive portion on the PCB,
wherein the first conductive portion is disposed, at a periphery of the second side of the second plate and between the first side of the second plate and the first slit, when viewed from above the second plate, and
wherein the first conductive portion is electrically connected to one point of the second plate facing the first conductive portion of the PCB.

16. The portable electronic device of claim 15, wherein the second slit of the second plate is formed by a part of the second side of the second plate and the side member.

* * * * *